US011189866B2

United States Patent
Moon et al.

(10) Patent No.: US 11,189,866 B2
(45) Date of Patent: Nov. 30, 2021

(54) BATTERY PACK AND ELECTRONIC DEVICE FOR SELECTING PATH FOR MEASURING VOLTAGE OF BATTERY CELL

(71) Applicant: SAMSUNG ELECTRONICS CO., LTD., Suwon-si (KR)

(72) Inventors: Sungsoo Moon, Suwon-si (KR); Chihyuan Lin, Suwon-si (KR); Sunggeun Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 155 days.

(21) Appl. No.: 16/680,655

(22) Filed: Nov. 12, 2019

(65) Prior Publication Data

US 2020/0153055 A1    May 14, 2020

(30) Foreign Application Priority Data

Nov. 12, 2018    (KR) .................. 10-2018-0138353

(51) Int. Cl.
*H01M 10/48*    (2006.01)
*H01M 10/42*    (2006.01)
(Continued)

(52) U.S. Cl.
CPC ........ *H01M 10/48* (2013.01); *G01R 31/3644* (2013.01); *H01M 10/4257* (2013.01);
(Continued)

(58) Field of Classification Search
CPC ...... H02J 7/0026; H02J 7/0021; H02J 7/0029; H02J 7/0047; H01M 10/48; H01M 10/4257; H01M 10/46; H01M 2010/4271
(Continued)

(56) References Cited

U.S. PATENT DOCUMENTS

2008/0012570 A1* 1/2008 Bucur .............. G01R 19/16542
                                                           324/426
2015/0054519 A1* 2/2015 Tomonaga ........... G01R 31/396
                                                           324/434
(Continued)

FOREIGN PATENT DOCUMENTS

CN           206685918          11/2017

OTHER PUBLICATIONS

International Search Report and Written Opinion dated Feb. 19, 2020 in counterpart International Patent Application No. PCT/KR2019/015067.

*Primary Examiner* — Nathaniel R Pelton
(74) *Attorney, Agent, or Firm* — Nixon & Vanderhye P.C.

(57) ABSTRACT

According to an embodiment, a battery pack comprises a battery cell including a positive electrode and a negative electrode and configured to generate an electromotive force via the positive electrode and the negative electrode, a plurality of first sub paths configured to connect the positive electrode to a sensing circuit of an electronic device to which the battery pack is connected, a plurality of second sub paths configured to connect the negative electrode to the sensing circuit, a power line configured to connect the positive electrode and the negative electrode to at least one of a system of the electronic device or a charging circuit of the electronic device, a first switch configured to selectively connect at least one of the plurality of first sub paths, selected depending on a voltage applied to the positive electrode and the negative electrode, to the sensing circuit, and a second switch configured to selectively connect at least one of the plurality of second sub paths, selected depending on the voltage, to the sensing circuit.

20 Claims, 14 Drawing Sheets

(51) Int. Cl.
*H02J 7/00* (2006.01)
*G01R 31/36* (2020.01)
*H01M 10/46* (2006.01)

(52) U.S. Cl.
CPC ........... *H01M 10/46* (2013.01); *H02J 7/0026* (2013.01); *H02J 7/0029* (2013.01); *H01M 2010/4271* (2013.01)

(58) Field of Classification Search
USPC ........................................................ 320/107
See application file for complete search history.

(56) References Cited

U.S. PATENT DOCUMENTS

| | | | |
|---|---|---|---|
| 2016/0093921 A1* | 3/2016 | Kadirvel | H02J 7/00 320/112 |
| 2016/0178684 A1* | 6/2016 | Kato | G01R 31/54 324/437 |
| 2018/0145521 A1 | 5/2018 | Hwang et al. | |
| 2018/0151921 A1 | 5/2018 | Yun | |
| 2018/0175444 A1 | 6/2018 | Ziegler et al. | |

* cited by examiner

BATTERY PACK AND ELECTRONIC DEVICE FOR SELECTING PATH FOR MEASURING VOLTAGE OF BATTERY CELL

CROSS-REFERENCE TO RELATED APPLICATION

This application is based on and claims priority under 35 U.S.C. § 119 to Korean Patent Application No. 10-2018-0138353, filed on Nov. 12, 2018, in the Korean Intellectual Property Office, the disclosure of which is incorporated by reference herein in its entirety.

BACKGROUND

Field

The disclosure relates to a battery pack and electronic device for selecting a path for measuring the voltage of a battery cell.

Description of Related Art

A battery cell includes a positive electrode, a negative electrode, and a separation membrane. As lithium ions move between the positive electrode and the negative electrode, the battery cell may be charged or discharged. The separation membrane separates the positive electrode and the negative electrode from each other and is used for the purpose of moving lithium ions. In lithium batteries, lithium ions may have different states at the positive electrode and negative electrode. This state difference leads to an electric potential difference between the positive electrode and negative electrode, which may move electrons, thereby causing discharging. Thus, an electric current may flow from the aluminum foil, which is a positive current collector, to the copper foil, which is a negative current collector. A battery pack may be a product with a housing for battery cells. The battery pack may be detachably coupled to an electronic device or be housed integrally in the electronic device, depending on the specifications of the electronic device.

Battery packs are available with a path for directly measuring the voltage of the battery cells so as to more precisely control quick charging and identify the state of charging (SoC) of the battery. Measurement of the voltage of the battery cells rather than the battery pack allows for more precise charging based on a more accurate voltage, thus reducing charging time and enabling stable charging.

If the voltage of a battery is reduced to a preset overcharge cut-off voltage or less as the battery is discharged, it is required that a field effect transistor (FET) of the protection circuit be opened so that the battery pack is electrically separated from a system (e.g., an electronic device housing the battery). However, in the case of a battery pack with a path for measuring the voltage of the battery cells, the battery cell voltage measurement circuit connects to the system without passing through the protection circuit. This is why the electronic device needs to continue to measure the voltage of the battery cells even while the protection circuit operates.

A leakage loop may be formed from the battery cell to the system via the path for measuring the voltage of the battery cell, causing leakage current. This may cause extra discharging in the battery cells and accelerate the discharge of battery cell voltage, with the result of negative influences on the battery cells, such as swelling or charging defects, or failure to guarantee the voltage that the battery cells are supposed to have. Further, noise may be introduced into each terminal of the battery cell sensing circuit, deteriorating the accuracy of measurement of battery cell voltage.

The above information is presented as background information only to assist with an understanding of the disclosure. No determination has been made, and no assertion is made, as to whether any of the above might be applicable as prior art with regard to the disclosure.

SUMMARY

Embodiments of the disclosure address the foregoing and/or other issues. According to various example embodiments, a battery pack and electronic device which include a plurality of paths for measuring a battery cell and may measure the battery cell depending on the voltage of the battery cell may be provided. According to various example embodiments, a battery pack and electronic device including a buffer circuit may be provided.

In accordance with various example embodiments, a battery pack comprises a battery cell including a positive electrode and a negative electrode and configured to generate an electromotive force via the positive electrode and the negative electrode, a plurality of first sub paths configured to connect the positive electrode to a sensing circuit of an electronic device to which the battery pack is connected, a plurality of second sub paths configured to connect the negative electrode to the sensing circuit, a power line configured to connect the positive electrode and the negative electrode to at least one of a system of the electronic device or a charging circuit of the electronic device, a first switch configured to selectively connect at least one of the plurality of first sub paths to the sensing circuit, the at least one of the plurality of first sub paths being selected depending on a voltage applied to the positive electrode and the negative electrode, and a second switch configured to selectively connect at least one of the plurality of second sub paths to the sensing circuit, the at least one of the plurality of second sub paths being selected depending on the voltage applied to the positive electrode and the negative electrode.

In accordance with various example embodiments, an electronic device electrically connected with a battery pack comprises a sensing circuit configured to measure a voltage applied to a positive electrode and a negative electrode of a battery cell included in the battery pack, the battery pack being configured to generate an electromotive force via the positive electrode and the negative electrode, a plurality of first sub paths configured to connect the positive electrode to the sensing circuit, a plurality of second sub paths configured to connect the negative electrode to the sensing circuit, a power line configured to receive power from the battery cell, a first switch configured to selectively connect at least one first sub path, selected among the plurality of first sub paths depending on the voltage, to the sensing circuit, and a second switch configured to selectively connect at least one second sub path, selected among the plurality of second sub paths depending on the voltage, to the sensing circuit.

Other aspects, advantages, and salient features of the disclosure will become apparent to those skilled in the art from the following detailed description, which, taken in conjunction with the annexed drawings, discloses various example embodiments of the disclosure.

BRIEF DESCRIPTION OF THE DRAWINGS

The above and other aspects, features and advantages of certain embodiments of the present disclosure will be more apparent from the following detailed description, taken in conjunction with the accompanying drawings, in which.

Throughout the drawings, like reference numerals will be understood to refer to like parts, components, and structures.

DETAILED DESCRIPTION

Figure 1:
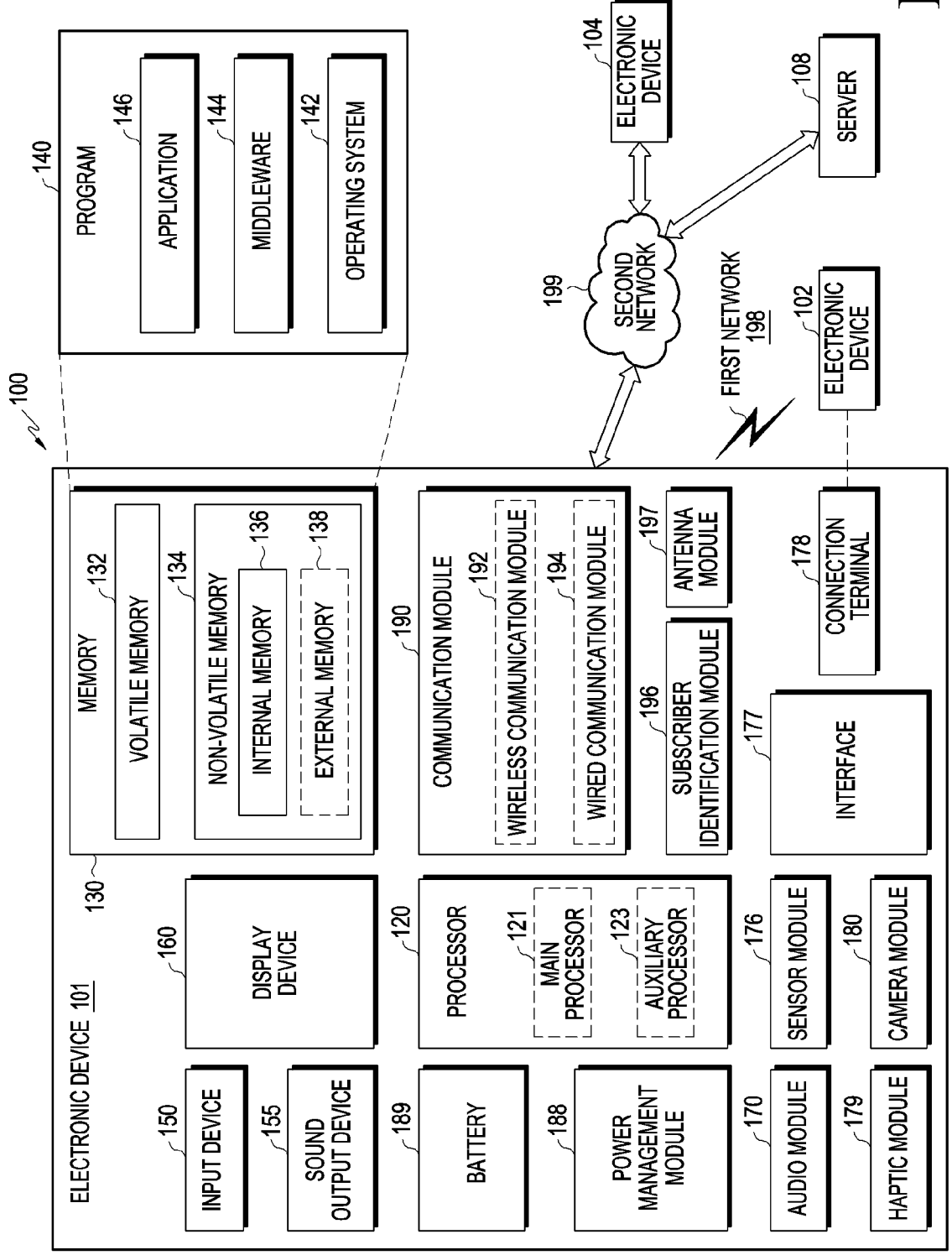
FIG. 1 is a block diagram illustrating an example electronic device in a network environment according to an embodiment.

FIG. 1 is a block diagram 1 illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, e.g., software (e.g., a program 140) to control at least one other component (e.g., a hardware or software component) of the electronic device 101 connected with the processor 120 and may process or compute various data. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing recordings, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain a sound through the input device 150 or output a sound through the sound output device 155 or an external electronic device (e.g., an electronic device 102 (e.g., a speaker or a headphone)) directly or wirelessly connected with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his or her tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 388 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or wireless communication channel between the electronic device 101 and an external electronic device (e.g., the electronic device 102, the electronic device 104, or the server 108) and performing communication through the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include one antenna including a radiator formed of a conductor or conductive pattern formed on a substrate (e.g., a printed circuit board (PCB)). According to an embodiment, the antenna module 197 may include a plurality of antennas. In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The first and second external electronic devices 102 and 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
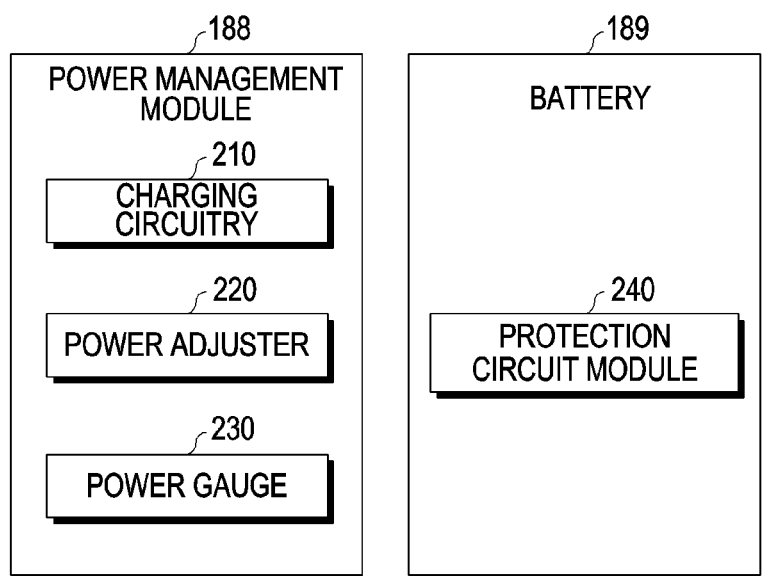
FIG. 2 is a block diagram illustrating an example power management module and a battery according to an embodiment.

FIG. 2 is a block diagram 2 illustrating the power management module 188 and the battery 189 according to various embodiments.

Referring to FIG. 2, the power management module 188 may include charging circuitry 210, a power adjuster (e.g., including power adjusting circuitry) 220, and/or a power gauge 230. The charging circuitry 210 may charge the battery 189 using power supplied from an external power source outside the electronic device 101. According to an embodiment, the charging circuitry 210 may select a charging scheme (e.g., normal charging or quick charging) based at least in part on a type of the external power source (e.g., a power outlet, a USB, or wireless charging), magnitude of power suppliable from the external power source (e.g., about 20 Watt or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 220 may include various power adjusting circuitry and generate a plurality of powers having different voltage levels or different current levels by adjusting a voltage level or a current level of the power supplied from the external power source or the battery 189. The power adjuster 220 may adjust the voltage level or the current level of the power supplied from the external power source or the battery 189 into a different voltage level or current level appropriate for each of some of the components included in the electronic device 101. According to an embodiment, the power adjuster 220 may be implemented, for example, and without limitation, in the form of a low drop out (LDO) regulator, a switching regulator, or the like. The power gauge 230 may measure use state information about the battery 189 (e.g., a capacity, a number of times of charging or discharging, a voltage, a temperature of the battery 189, etc.).

The power management module 188 may determine, using, for example, the charging circuitry 210, the power adjuster 220, and/or the power gauge 230, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to be abnormal, the power management module 188 may adjust the charging of the battery 189 (e.g., reduce the charging current or voltage or stop the charging). According to an embodiment, at least some of the functions of the power management module 188 may be performed by an external control device (e.g., the processor 120).

The battery 189, according to an embodiment, may include a protection circuit module (PCM) (e.g., including a battery protection circuit) 240. The PCM 240 may perform one or more of various functions (e.g., a pre-cutoff function) to prevent and/or reduce a performance deterioration of, or damage to, the battery 189. The PCM 240, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured or sensed using a corresponding sensor (e.g., a temperature sensor) of the sensor module 276, the power gauge 230, or the power management module 188. According to an embodiment, the corresponding sensor (e.g., a temperature sensor) of the sensor module 176 may be included as part of the PCM 140 or may be disposed near the battery 189 as a separate device.

Figure 3:
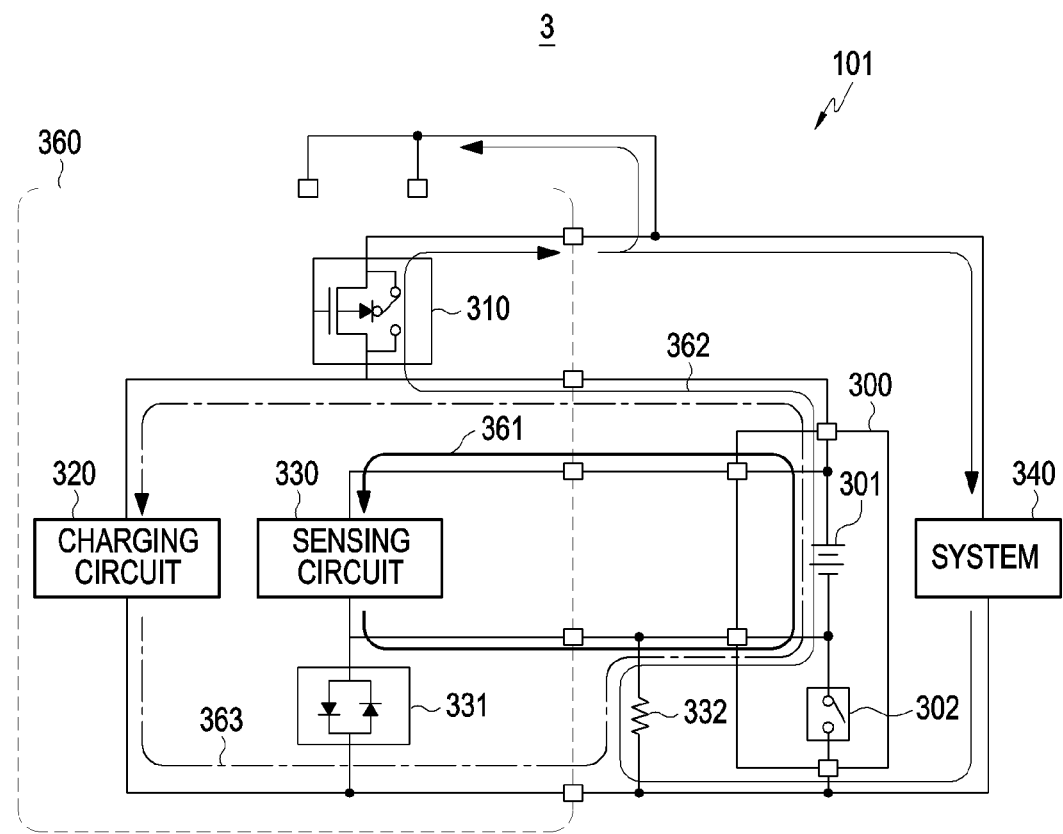
FIG. 3 is a diagram illustrating an example battery pack and an electronic device according to an embodiment.

FIG. 3 is a diagram 3 illustrating an example battery pack and an electronic device according to an embodiment.

Referring to FIG. 3, according to an embodiment, a battery pack 300 (e.g., the battery 189 of FIG. 1) may include a battery cell 301 and a protection circuit 302 (e.g., the battery protection circuit 240 of FIG. 2). According to an embodiment, an electronic device 101 may include at least one of a discharge control switch 310, a charging circuit 320, a sensing circuit 330, an electro-static discharge preventing/protection circuit 331, a leakage current preventing/controlling resistor 332, and/or a system 340.

According to an embodiment, the battery cell 301 may generate an electromotive force, and the battery cell 301 may include some components, such as, for example, a positive electrode, a negative electrode, a separation membrane, and an electrolyte. The battery pack 300 may be electrically connected with the electronic device 101, and the battery pack 300 may provide power with a preset voltage and current to the electronic device 101 via a power line. Depending on the specifications of the electronic device 101, the battery pack 300 may be integrally formed with the electronic device 101, or the battery pack 300 may be detachably coupled to the electronic device 101. The battery pack 300 may be a secondary battery, e.g., a lithium ion battery. When the electronic device 101 is fabricated as a compact mobile terminal, e.g., a smartphone, the battery pack 300 may be shaped as a rectangular block, but it will readily be appreciated by one of ordinary skill in the art that the battery pack 300 is not limited to a specific kind or shape.

According to an embodiment, the protection circuit 302 may turn on or off depending on the voltage of the battery cell 301. For example, when the voltage of the battery cell 301 falls within a first designated range (e.g., a normal range), the switch of the protection circuit 302 may be controlled to turn on, and the battery cell 301 may connect to the system 340. For example, when the voltage of the battery cell 301 falls within a second designated range (e.g., an abnormal range), the switch of the protection circuit 302 may be controlled to turn off, and the battery cell 301 may be electrically separated from the system 340. Although the protection circuit 302 is illustrated as including a single switch for illustration purposes, this is merely an example. The protection circuit 302 may include one or more switches, and a detailed example thereof is described below in connection with FIG. 4.

According to an embodiment, the charging circuit 320 (e.g., the charging circuit 210) may charge the battery cell 301 in the battery pack 300 with power provided from the outside through a charging port. The charging circuit 320 may adjust at least one of the voltage or current of power provided from the outside depending on various charging modes and may transfer the result to the battery cell 301. For example, the charging circuit 320 may charge the battery cell 301 while maintaining a designated current based on a constant current (CC) mode. The charging circuit 320 may charge the battery cell 301 while maintaining a designated voltage based on a constant voltage (CV) mode. The charging circuit 320 may provide power with at least one of the voltage or current set in a quick charging mode to the battery cell 301 based on the quick charging mode. According to an embodiment, the charging circuit 320 may determine the charging mode based on at least the magnitude of voltage applied to both ends of the battery cell 301 and may transfer power with at least one of the current or voltage required in the determine charging mode to the battery cell 301. The charging circuit 320 may determine the charging mode based on the voltage applied to both ends of the battery cell 301 which is measured or sensed by the sensing circuit 330. The sensing circuit 330 may measure or sense the voltage of the battery cell 301 which has been noise-removed and fluctuation-suppressed before entering into, e.g., the quick charging mode. In this example, the voltage of the battery cell 301 may be measured or sensed via a buffer, which is described below in greater detail.

According to an embodiment, the sensing circuit 330 may measure or sense the voltage applied to both ends of the battery cell 301. The sensing circuit 330 may be electrically connected with both ends of the battery cell 301, and thus, the sensing circuit 330 may measure or sense the voltage applied to both ends of the battery cell 301. According to an embodiment, there may be a plurality of paths between both input ends of the sensing circuit 330 and both ends of the battery cell 301, which are described in greater detail below with reference, for example, to FIGS. 6A, 6B, 8, 11, 12, and/or 13. The plurality of paths may be positioned inside or outside the battery pack 300.

According to an embodiment, the discharge control switch 310 may selectively connect one end of the battery pack 300, e.g., the battery cell 301, to the system 340. For example, the on/off state of the discharge control switch 310 may be controlled depending on the voltage applied to both ends of the battery cell 301. When the discharge control switch 310 is in the on state, the battery cell 301 may connect to the system 340. When the discharge control switch 310 is in the off state, the battery cell 301 may be electrically separated from the system 340. The electrostatic discharge preventing/protection circuit 331 may prevent and/or avoid an over voltage generated from the outside, e.g., static electricity, from being applied to the sensing circuit 330 or the battery cell 301. The leakage current preventing/controlling resistor 332 may be a resistor that measures, e.g., about 1 kΩ to about 10 kΩ and the leakage current preventing/controlling resistor 332 may prevent and/or reduce application of leakage current from the battery cell 301 to the system 340. The system 340 may include at least one of various hardware components of the electronic device 101.

A charging integrated circuit (IC) 360 may include at least part of the configuration of an interface power management integrated circuit (IFPMIC) or a power management integrated circuit (PMIC). The PMIC may receive power from the battery cell 301 and process the power to have a voltage or current appropriate for the hardware of the electronic device 101 and transfer the processed power to each hardware component.

As set forth above, when the voltage of the battery cell 301 falls within a range indicating an abnormal state, the switch of the protection circuit 302 may be controlled to turn off. Thus, the battery cell 301 may be electrically opened from the system 340, and discharge from the battery cell 301 to the system 340 may be prevented and/or reduced. However, a leakage current 361 may flow from the battery cell 301 to the sensing circuit 330 according to a loop formed by the battery cell 301 and the sensing circuit 330. A leakage current 362 may be rendered to flow by the battery cell 301 and the charging IC 360 or other blocks connected with the charging IC 360. A leakage current 363 may flow from the battery cell 301 to the charging circuit 320 according to a loop formed by the battery cell 301 and the charging circuit 320.

Figure 4:
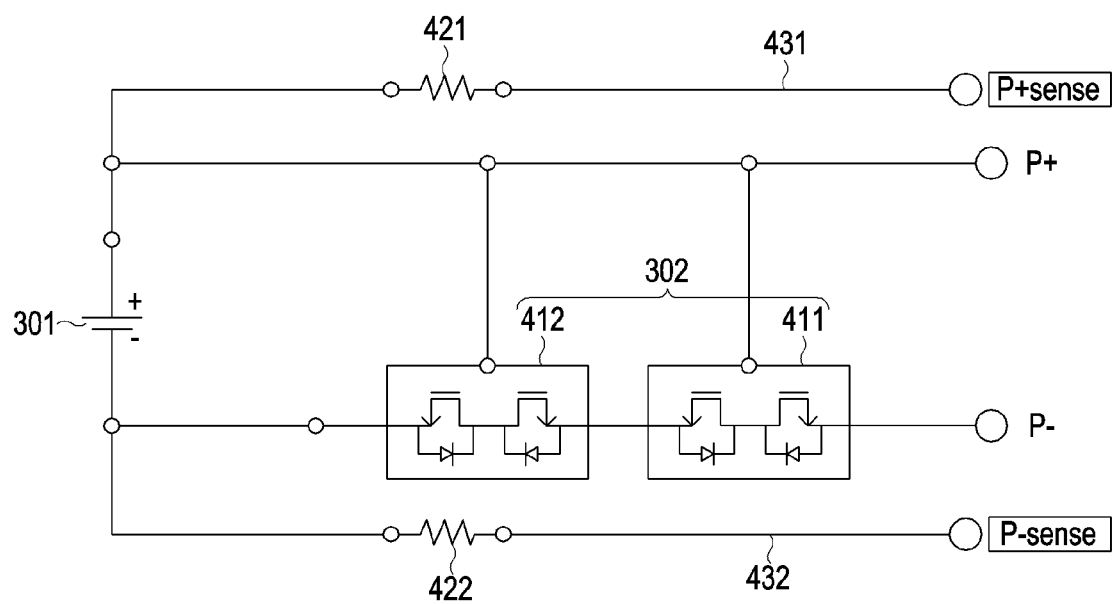
FIG. 4 is a diagram illustrating an example protection circuit according to an embodiment.

FIG. 4 is a diagram 4 illustrating an example protection circuit according to an embodiment.

Referring to FIG. 4, a first protection circuit 411 and a second protection circuit 412 may be connected to the positive electrode (+) of the battery cell 301. The second protection circuit 412 may be connected to the negative electrode (−) of the battery cell 301. The negative electrode (−) of the battery cell 301 may be connected to the first protection circuit 411 via the second protection circuit 412. When the magnitude of voltage applied to both ends of the battery cell 301 is a first value or more, the first protection circuit 411 may be controlled to turn on and, when the magnitude of voltage applied to both ends of the battery cell 301 is less than the first value, the first protection circuit 411 may be controlled to turn off. When the magnitude of voltage applied to both ends of the battery cell 301 is a second value or more, the second protection circuit 412 may be controlled to turn on and, when the magnitude of voltage applied to both ends of the battery cell 301 is less than the second value, the second protection circuit 412 may be controlled to turn off. The first value may be larger than the second value. Thus, when the magnitude of voltage applied to both ends of the battery cell 301 is the first value or more, the first protection circuit 411 and the second protection circuit 412 both may be controlled to turn on and, thus, both ends of the battery cell 301 may be connected to power output terminals P+ and P−. The path connecting both ends of the battery cell 301 to the power output terminals P+ and P− may be referred to, for example, as a power line or power lane. The power output terminals P+ and P− may be connected, for example, to the system 340 of FIG. 3. When the magnitude of voltage applied to both ends of the battery cell 301 is not less than the second value and less than the first value, the first protection circuit 411 may be controlled to turn off, and the second protection circuit 412 may be controlled to turn on. When the magnitude of voltage applied to both ends of the battery cell 301 is less than the second value, the first protection circuit 411 and the second protection circuit 412 may be controlled to turn off. The voltage to determine on/off of each of the first protection circuit 411 and the second protection circuit 412 may be set per manufacturer or depending on standards, but is not limited thereto. Although two protection circuits, e.g., the first protection circuit 411 and the second protection circuit 412, are shown, this is merely an example, and the number of protection circuits is not limited. Although not shown, the battery pack 300 may include an additional element for controlling the on/off state of the switches included in the first protection circuit 411 and the second protection circuit 412. For example, the battery pack 300 may include a computation circuit that determines the on/off state of the first protection circuit 411 and the second protection circuit 412 based on the voltage applied to both ends of the battery cell 301 and outputs a control signal (e.g., a gate application voltage). The battery pack 300 may include a first comparator that receives a voltage for determining on/off of the first protection circuit 411 as a reference voltage and a voltage from at least one electrode of the battery cell 301 as a voltage for comparison. For example, a node with the potential of the reference voltage may be connected to one end of the first comparator, and a structure or scheme for generating the reference voltage at the node is not limited to a specific one. For example, when the voltage from at least one electrode of the battery cell 301 is not less than a voltage for determining on/off of the first protection circuit 411, the first comparator may output a gate voltage for turning on the first protection circuit 411. For example, when the voltage from at least one electrode of the battery cell 301 is less than the voltage for determining on/off of the first protection circuit 411, the first comparator may output a gate voltage for turning off the first protection circuit 411. The battery pack 300 may include a second comparator that receives a voltage for determining on/off of the second protection circuit 412 as a reference voltage and a voltage from at least one electrode of the battery cell 301 as a voltage for comparison. For example, a node with the potential of the reference voltage may be connected to one end of the second comparator, and a structure or scheme for generating the reference voltage at the node is not limited to a specific one. For example, when the voltage from at least one electrode of the battery cell 301 is not less than a voltage for determining on/off of the second protection circuit 412, the second comparator may output a gate voltage for turning on the second protection circuit 412. For example, when the voltage from at least one electrode of the battery cell 301 is less than the voltage for determining on/off of the second protection circuit 412, the second comparator may output a gate voltage for turning off the second protection circuit 412. The above-described controlling the on/off state of the protection circuits 411 and 412 is merely an example, and it will readily be appreciated by one of ordinary skill in the art that controlling the on/off state of the protection circuits 411 and 412 is not limited to a specific scheme or method.

As described above, both ends of the battery cell 301 may be connected to the sensing circuit 330 of FIG. 3. The positive electrode (+) and negative electrode (−) of the battery cell 301 may be connected to voltage sensing terminals (P+sense, P−sense), and the voltage sensing terminals (P+sense, P−sense) may be connected to the sensing circuit 330. The path 431 from the positive electrode (+) of the battery cell 301 to the first voltage sensing terminal P+sense may have its own resistance 421, and the path 432 from the negative electrode (−) of the battery cell 301 to the second voltage sensing terminal P−sense may have its own resistance 422. Thus, although at least one of the first protection circuit 411 or the second protection circuit 412 is controlled to turn off, a leakage current may flow from the battery cell 301 through the first path 431 and the second path 432, which may worsen discharge of the battery cell 301. Thus, according to an embodiment, the battery pack 300 or the electronic device 101 may include a plurality of paths between both ends of the battery cell 301 and the sensing circuit 330. The battery pack 300 or the electronic device 101 may control the on/off state of the switch of selectively open-circuiting or short-circuiting at least one path of a plurality of paths to transfer power for voltage sensing via at least one of the plurality of paths depending on the voltage applied to both ends of the battery cell 301. The plurality of paths may be positioned between the battery cell 301 and the voltage sensing terminals (P+sense, P−sense) or between the voltage sensing terminals (P+sense, P−sense) and the sensing circuit 330.

Figure 5:
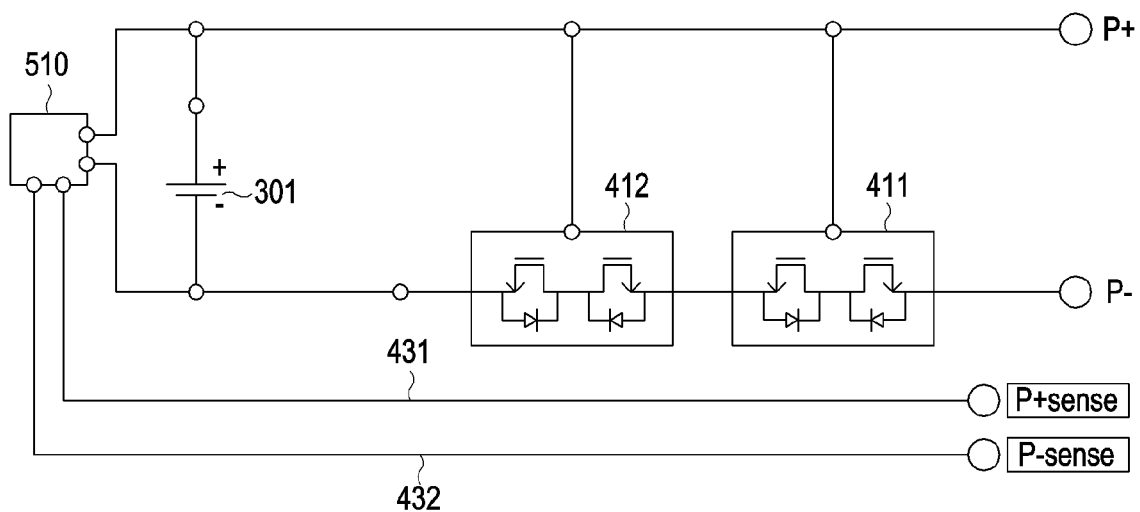
FIG. 5 is a diagram illustrating an example battery pack according to an embodiment.

FIG. 5 is a diagram 5 illustrating an example battery pack according to an embodiment.

Referring to FIG. 5, according to an embodiment, as compared with FIG. 4, the battery pack 300 may further include a sensing path selection block 510 connected between both ends of the battery cell 301 and the voltage sensing terminals (P+sense, P−sense). The sensing path selection block 510 may include a plurality of paths for connecting the positive electrode (+) of the battery cell 301 and the voltage sensing terminal P+sense and a plurality of paths for connecting the negative electrode (−) of the battery cell 301 and the voltage sensing terminal P−sense. Various embodiments of the plurality of paths are described in greater detail below with reference to FIGS. 6A, 6B, and 8.

According to an embodiment, the sensing path selection block 510 may connect at least one of the plurality of paths for connecting the positive electrode (+) of the battery cell 301 and the voltage sensing terminal P+sense to the voltage sensing terminal P+sense depending on the voltage of the battery cell 301. The sensing path selection block 510 may connect at least one of the plurality of paths for connecting the negative electrode (−) of the battery cell 301 and the voltage sensing terminal P−sense to the voltage sensing terminal P−sense depending on the voltage of the battery cell 301. For example, when the voltage of the battery cell 301 is not less than a voltage set to control the on/off state of the first protection circuit 411, the sensing path selection block 510 may be configured to select a first path among the plurality of paths. As used herein, 'selecting a first path among a plurality of paths' may refer, for example, to connecting at least one of a plurality of paths for connecting from the positive electrode (+) of the battery cell 301 to the voltage sensing terminal P+sense to the voltage sensing terminal P+sense and connecting at least one of a plurality of paths for connecting from the negative electrode (−) of the battery cell 301 to the voltage sensing terminal P−sense to the voltage sensing terminal P−sense. In other words, selecting a path may refer, for example, to selecting a path group for connecting the positive electrode and negative electrode of the battery cell 301 to their respective corresponding voltage sensing terminals. Further, connecting at least one of a plurality of paths to the voltage sensing terminals (P+sense, P−sense) may refer, for example, to connecting a single path of the plurality of paths to the voltage sensing terminals (P+sense, P−sense) or may refer, for example, to connecting two or more paths of the plurality of paths to the voltage sensing terminals (P+sense, P−sense). This is described below in greater detail below with reference to FIGS. 6A and 6B.

Although in the above-described example, a reference voltage for selecting at least one of the plurality of paths is the same as a reference voltage for controlling on/off the first protection circuit 411, this is merely an example. The reference voltage for selecting at least one of the plurality of paths may be the same as the reference voltage for controlling on/off the second protection circuit 412 or may be set to differ from the reference voltage for controlling on/off the protection circuits 411 and 412.

Each of the plurality of paths included in the sensing path selection block 510 may have a different resistance. For example, the resistance of a first path among the plurality of paths may be higher than the resistance of a second path. In this example, if the battery cell 301 is connected to the sensing circuit 330 via the first path, a smaller magnitude of leakage current may flow via the first path than via the second path. Each of the plurality of paths may have a different width of the wire of the path, or a resistance element with a different resistance may be placed on each of the path, so that each path has a different resistance.

According to an embodiment, the battery pack 300 may include at least one switch for selectively connecting at least some of the plurality of paths to the voltage sensing terminals (P+sense, P−sense). The battery pack 300 may connect at least some of the plurality of paths to the voltage sensing terminals (P+sense, P−sense) by controlling the on/off state of at least one switch of the battery cell 301. Although not shown, the battery pack 300 may include, for example, and without limitation, a control circuit, comparator, or the like, capable of controlling the on/off state of at least one switch depending on the voltage of the battery cell 301. The means capable of controlling the on/off state of at least one switch may also be included in the sensing path selection block 510 or be positioned outside the sensing path selection block 510.

Figure 6A:
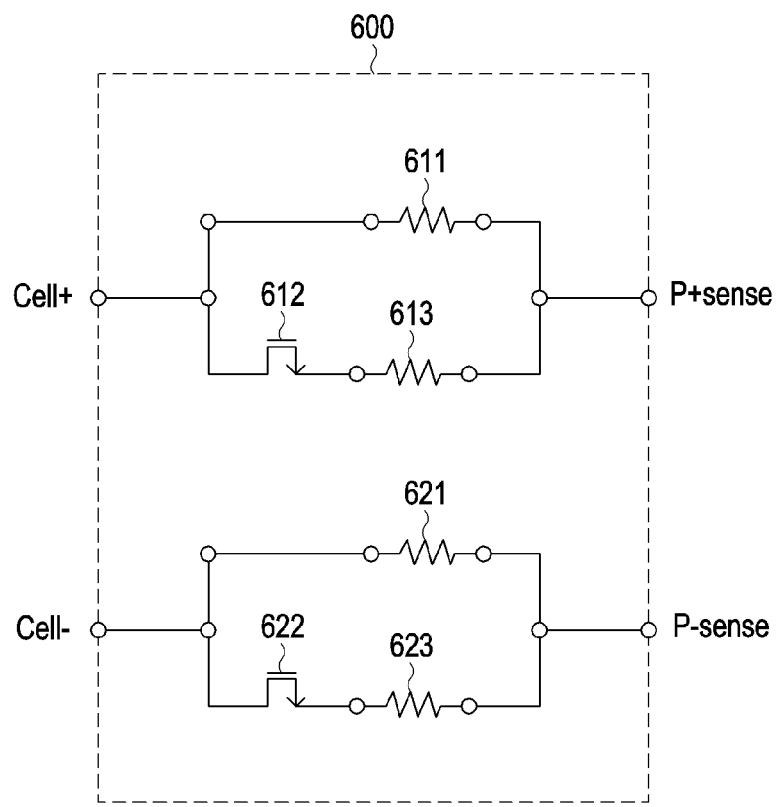
FIG. 6A is a diagram illustrating an example sensing path selection block according to an embodiment.
Figure 6B:
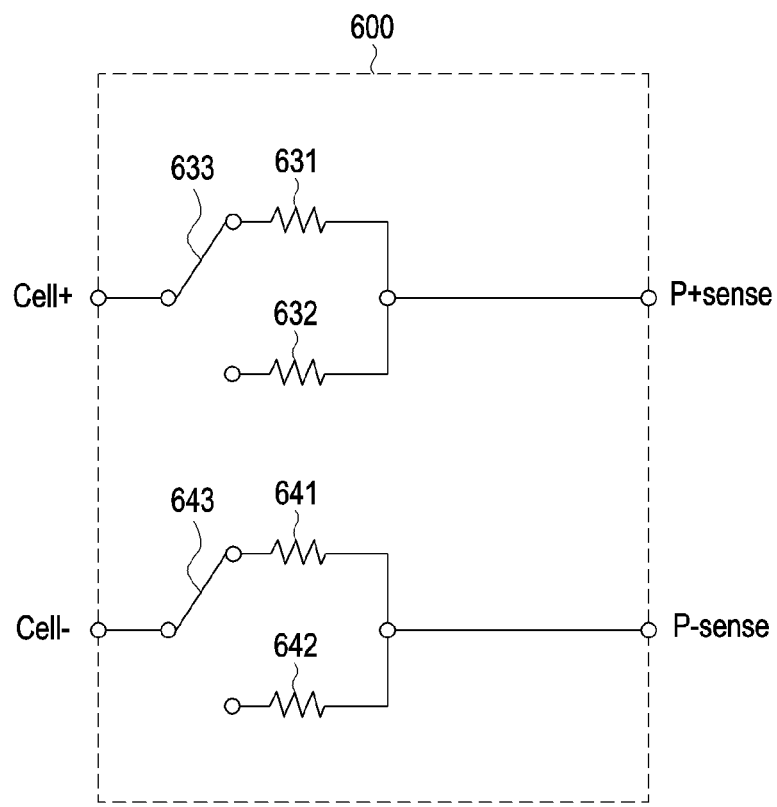
FIG. 6B is a diagram illustrating an example sensing path selection block according to an embodiment.

FIGS. 6A and 6B are diagrams illustrating example sensing path selection blocks according to an embodiment.

Referring to FIG. 6A, according to an embodiment, a sensing path selection block 600 (e.g., the sensing path selection block 510 of FIG. 5) may include a first input terminal Cell+ for connecting to the positive electrode (+) of the battery cell 301, a second input terminal Cell− for connecting to the negative electrode (−) of the battery cell 301, and voltage sensing terminals (P+sense, P−sense). The voltage sensing terminals (P+sense, P−sense), respectively, may connect to both ends of the sensing circuit 330. A first sub path connected with a first resistor 611 and a second sub path connected with a second resistor 613 may be connected to the first input terminal Cell+. The first resistor 611 and the second resistor 613 may be connected in parallel with each other. A third sub path connected with a third resistor 621 and a fourth sub path connected with a fourth resistor 623 may be connected to the second input terminal Cell−. The third resistor 621 and the fourth resistor 623 may be connected in parallel with each other. For illustration purposes, the first sub path and the third sub path being selected is referred to as a first path being selected, and the second sub path and the fourth sub path being selected is referred to as a second path being selected. The resistance of the first resistor 611 may be higher than the resistance of the second resistor 613, and the resistance of the third resistor 621 may be higher than the resistance of the fourth resistor 623. A first switch 612 may selectively connect the first input terminal Cell+ and the second resistor 613, and a second switch 622 may selectively connect the second input terminal Cell− and the fourth resistor 623.

According to an embodiment, when the voltage applied to both ends of the battery cell 301 is a first value or more, the first switch 612 and the second switch 622 may be controlled to turn on and, when the voltage applied to both ends of the battery cell 301 is less than the first value, the first switch 612 and the second switch 622 may be controlled to turn off. As set forth above, a control signal for controlling the on/off state of the first switch 612 and the second switch 622 may be generated inside the sensing path selection block 600 or generated by a hardware component outside the sensing path selection block 600. The first value may be the same as a reference voltage for controlling the on/off state of the first protection circuit 411 in the battery pack 300 or a reference voltage for controlling the on/off state of the second protection circuit 412 or, alternatively, the first value may be set to differ from the reference voltages.

When the first switch 612 and the second switch 622 are controlled to turn on, the first input terminal Cell+ may connect to the voltage sensing terminal P+sense via the first sub path and the second sub path. Since the resistance of the first resistor 611 on the first sub path is higher than the resistance of the second resistor 613 on the second sub path, current from the positive electrode (+) of the battery cell 301 may be delivered to the sensing circuit 330 substantially via the second sub path and the voltage sensing terminal P+sense. Thus, when the voltage applied to both ends of the battery cell 301 is not less than the first value, current may be transferred from the battery cell 301 to the sensing circuit 330 via the second path (e.g., the second sub path and the fourth sub path) corresponding to a relatively low resistance.

When the first switch 612 and the second switch 622 are controlled to turn off, the first input terminal Cell+ may connect to the voltage sensing terminal P+sense via the first sub path, and the second input terminal Cell− may connect to the voltage sensing terminal P−sense via the third sub path. When the voltage applied to both ends of the battery cell 301 is less than the first value, current may be transferred from the battery cell 301 to the sensing circuit 330 via the first path (e.g., the first sub path and the third sub path) corresponding to a relatively high resistance. Further, in this case, at least one of the first protection circuit 411 or the second protection circuit 412 is controlled to turn off and, thus, current from the battery cell 301 to the power output terminals P+ and P− may be cut off. Further, since current is transferred via the first path (e.g., the first sub path and the third sub path) corresponding to a relatively high resistance, the magnitude of leakage current from the battery cell 301 to the sensing circuit 330 may reduce.

Referring to FIG. 6B, according to an embodiment, a sensing path selection block 600 (e.g., the sensing path selection block 510 of FIG. 5) may include a first input terminal Cell+ for connecting to the positive electrode (+) of the battery cell 301, a second input terminal Cell− for connecting to the negative electrode (−) of the battery cell 301, and voltage sensing terminals (P+sense, P−sense). The voltage sensing terminals (P+sense, P−sense), respectively, may connect to both ends of the sensing circuit 330. A first sub path connected with a first resistor 631 and a second sub path connected with a second resistor 632 may be connected to the first input terminal Cell+. The first resistor 631 and the second resistor 632 may be connected in parallel with each other. A third sub path connected with a third resistor 641 and a fourth sub path connected with a fourth resistor 642 may be connected to the second input terminal Cell−. The third resistor 641 and the fourth resistor 642 may be connected in parallel with each other.

The resistance of the first resistor 631 may be higher than the resistance of the second resistor 632, and the resistance of the third resistor 641 may be higher than the resistance of the fourth resistor 642. The first switch 633 may connect the first input terminal Cell+ to any one of the first resistor 631 and the second resistor 632, and the second switch 643 may connect the second input terminal Cell− to any one of the third resistor 641 and the fourth resistor 642.

According to an embodiment, when the voltage applied to both ends of the battery cell 301 is not less than a first value, the first switch 633 may connect the first input terminal Cell+ to the second resistor 632, and the second switch 643 may connect the second input terminal Cell− to the fourth resistor 642. According to an embodiment, when the voltage applied to both ends of the battery cell 301 is less than a first value, the first switch 633 may connect the first input terminal Cell+ to the first resistor 631, and the second switch 643 may connect the second input terminal Cell− to the third resistor 643. As set forth above, a control signal for controlling the on/off state of the first switch 633 and the second switch 643 may be generated inside the sensing path selection block 600 or generated by a hardware component outside the sensing path selection block 600. The first value may be the same as a reference voltage for controlling the on/off state of the first protection circuit 411 in the battery pack 300 or a reference voltage for controlling the on/off state of the second protection circuit 412 or, alternatively, the first value may be set to differ from the reference voltages.

When the voltage applied to both ends of the battery cell 301 is not less than the first value, current may be transferred from the battery cell 301 to the sensing circuit 330 via the second path (e.g., the second sub path and the fourth sub path) corresponding to a relatively low resistance. Further, in this case, most of the current output from the battery cell 301 may be transferred via the power output terminals P+ and P− to the system 340.

When the voltage applied to both ends of the battery cell 301 is less than the first value, current may be transferred from the battery cell 301 to the sensing circuit 330 via the first path (e.g., the first sub path and the third sub path) corresponding to a relatively high resistance. Further, in this case, at least one of the first protection circuit 411 or the second protection circuit 412 is controlled to turn off and, thus, current from the battery cell 301 to the power output terminals P+ and P− may be cut off. Further, since current is transferred via the first path (e.g., the first sub path and the third sub path) corresponding to a relatively high resistance, the magnitude of leakage current from the battery cell 301 to the sensing circuit 330 may reduce.

Figure 7A:
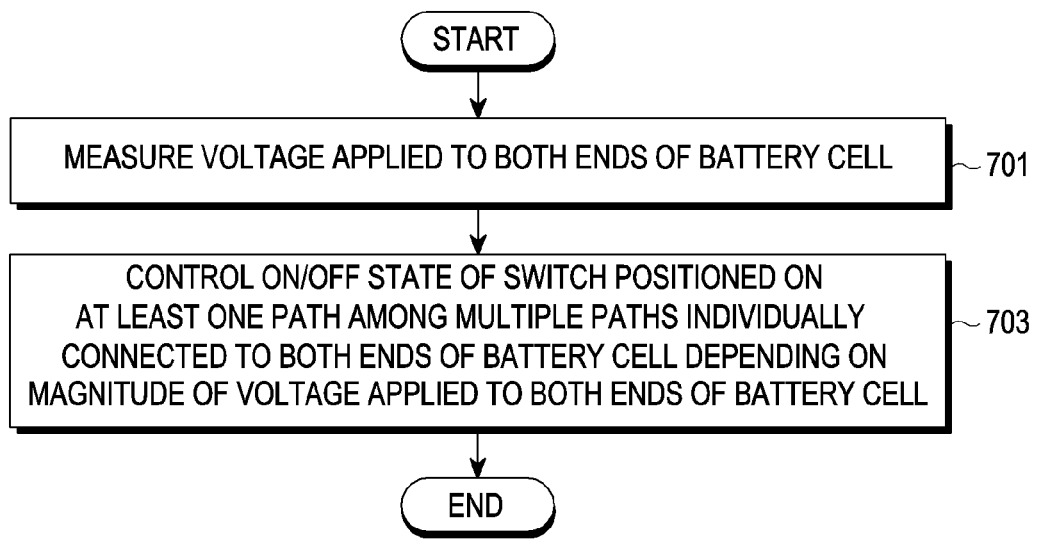
FIG. 7A is a flowchart illustrating an example method of controlling a battery pack or an electronic device according to an embodiment.
Figure 7B:
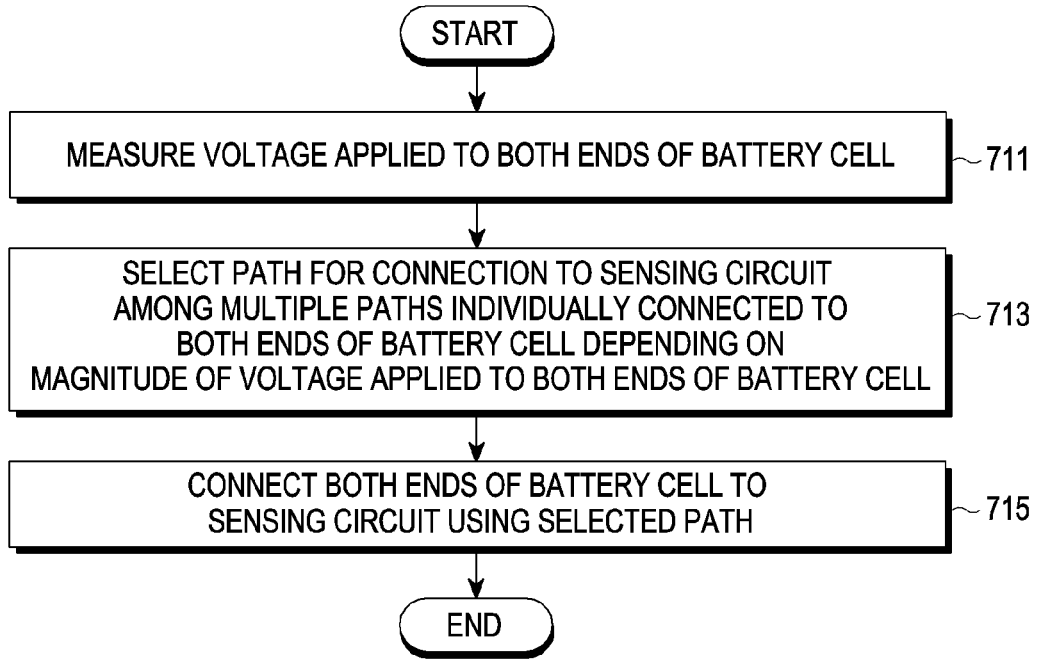
FIG. 7B is a flowchart illustrating an example method of controlling a battery pack or an electronic device according to an embodiment.

FIGS. 7A and 7B are flowcharts illustrating an example method of controlling a battery pack or an electronic device according to an embodiment.

Referring to FIG. 7A, in operation 701, the battery pack 300 or the electronic device 101 may measure or sense the voltage applied to both ends of the battery cell 301. In operation 703, the battery pack 300 or the electronic device 101 may control the on/off state of a switch (e.g., the switch 411 and 412) positioned on at least one path among a plurality of paths individually connected to both ends of the battery cell 301 depending on the magnitude of voltage applied to both ends of the battery cell 301. As set forth above, the battery pack 300 may include a means that outputs a control signal for controlling the on/off state of the switches 411 and 412 depending on the magnitude of voltage applied to both ends of the battery cell 301. As described below in greater detail, according to an embodiment, the electronic device 101 may include a means that outputs a control signal for controlling the on/off state of the switches 411 and 412 depending on the magnitude of voltage applied to both ends of the battery cell 301.

Referring to FIG. 7B, in operation 711, the battery pack 300 or the electronic device 101 may measure or sense the voltage applied to both ends of the battery cell. In operation 713, the battery pack 300 or the electronic device 101 may select a path for connecting to the sensing circuit 330 among a plurality of paths individually connected to both ends of the battery cell 301 depending on the magnitude of voltage applied to both ends of the battery cell 301. In operation 715, the battery pack 300 or electronic device 101 may connect both ends of the battery cell 301 to the sensing circuit 330 using the selected path. For example, as shown in FIG. 6B, the battery pack 300 or electronic device 101 may control at least one switch 633 or 643 to connect the battery cell 301 and the sensing circuit 330 via the selected path.

Figure 8:
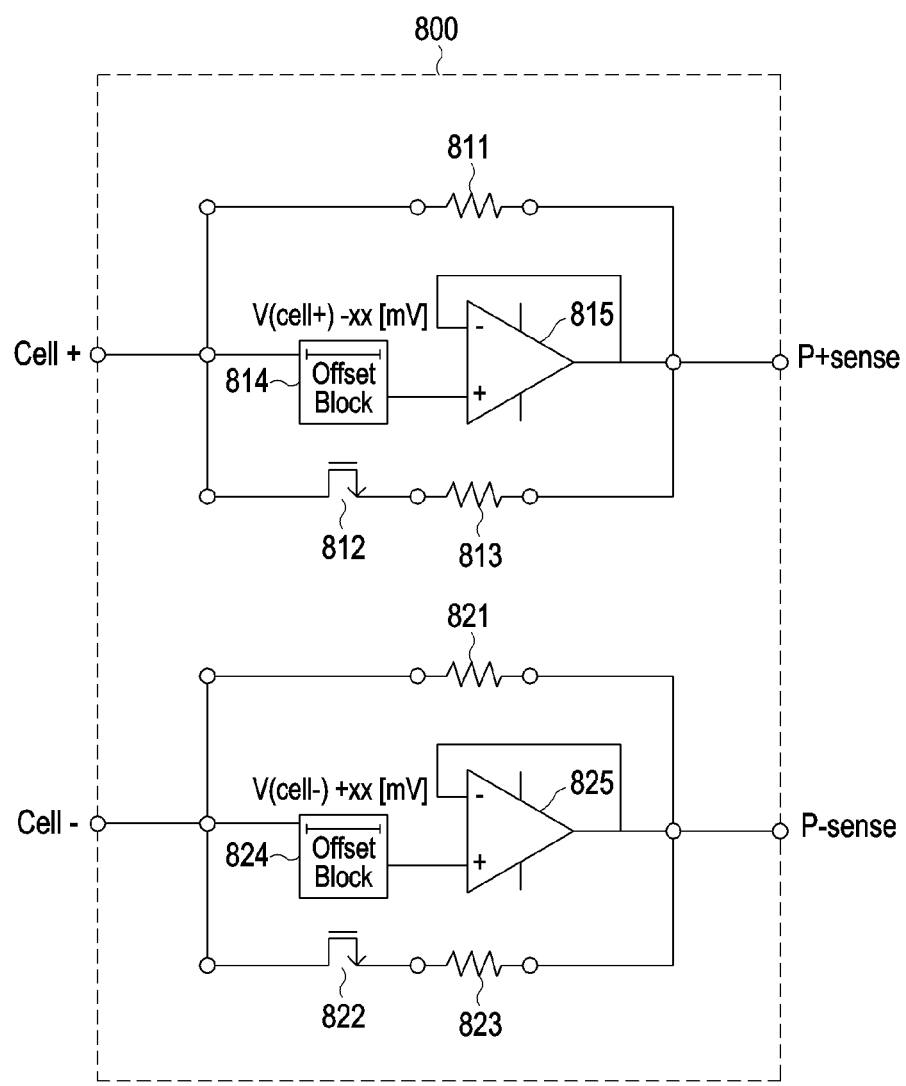
FIG. 8 is a diagram illustrating an example sensing path selection block according to an embodiment.

FIG. 8 is a diagram 8 illustrating an example sensing path selection block according to an embodiment.

Referring to FIG. 8, according to an embodiment, a sensing path selection block 800 (e.g., the sensing path selection block 510 of FIG. 5) may include a first input terminal Cell+ for connecting to the positive electrode (+) of the battery cell 301, a second input terminal Cell− for connecting to the negative electrode (−) of the battery cell 301, and voltage sensing terminals (P+sense, P−sense). The voltage sensing terminals (P+sense, P−sense), respectively, may connect to both ends of the sensing circuit 330. A first sub path connected with a first resistor 811, a second sub path connected with a first offset block 814, and a third sub path connected with a second resistor 813 may be connected to the first input terminal Cell+. The first resistor 811 and the second resistor 813 may be connected in parallel with each other. A first OP-AMP 815 may be connected with the second offset block 814. A fourth sub path connected with a third resistor 821, a fifth sub path connected with a second offset block 824, and a sixth sub path connected with a fourth resistor 823 may be connected to the second input terminal Cell−. The third resistor 821 and the fourth resistor 823 may be connected in parallel with each other. For illustration purposes, the first sub path and the fourth sub path being selected may be referred to as a first path being selected, the second sub path and the fifth sub path being selected may be referred to as a second path being selected, and the third sub path and the sixth sub path being selected may be referred to as a third path being selected. The resistance of the first resistor 811 may be higher than the resistance of the second resistor 813, and the resistance of the third resistor 821 may be higher than the resistance of the fourth resistor 823. A first switch 812 may selectively connect the first input terminal Cell+ and the second resistor 813, and a second switch 822 may selectively connect the second input terminal Cell− and the fourth resistor 823.

The first offset block 814 may apply a determined offset voltage (e.g., −xx mV) to an input voltage V(cell+), so that a voltage of V(cell+)−xx mV may be output from the first offset block 814. The first OP-AMP 815 may suppress noise from the input voltage (e.g., V(cell+)−xx mV), thus outputting an output voltage with a stable magnitude. For example, the potential at the input terminal of the first offset block 814 may be V(cell+) mV from the ground, and the potential at the output terminal of the first offset block 814 may be V(cell+)−xx mV from the ground. The voltage output from the first OP-AMP 815 may be fluctuation-suppressed over time. The second offset block 824 may apply a determined offset voltage (e.g., +xx mV) to an input voltage V(cell−), so that a voltage of V(cell−)+xx mV may be output from the second offset block 814. The second OP-AMP 825 may suppress noise from the input voltage (e.g., V(cell−)+xx mV), thus outputting an output voltage with a stable magnitude. The voltage output from the second OP-AMP 825 may be fluctuation-suppressed over time. The offset block and the OP-AMP may be referred to as a buffer circuit.

According to an embodiment, when the voltage applied to both ends of the battery cell 301 falls within a first range, the first switch 812 and the second switch 822 may be controlled to turn on, and the buffer circuit may be configured to turn off. When the voltage applied to both ends of the battery cell 301 falls within a second range, the first switch 812 and the second switch 822 may be controlled to turn off, and the buffer circuit may be configured to turn on. When the voltage applied to both ends of the battery cell 301 falls within a third range, the first switch 812 and the second switch 822 may be controlled to turn off, and the buffer circuit may be configured to turn off. The turn-on/off states of the switches and buffer circuit according to the first range to the third range may be shown, for example, in Table 1 below.

TABLE 1

| Range of battery cell voltage | operation state | |
|---|---|---|
| | on/off state of buffer circuit (e.g., the first offset block 814, the first OP-AMP 815, the second offset block 824, and the second OP-AMP 825) | switch (e.g., the first switch 812 and the second switch 822) |
| first range (e.g., not less than 0 V and less than xV) | turn-off | off state |
| second range (e.g., not less than xV and less than yV) | turn-on | off state |
| third range (e.g., not less than yV and less than zV) | turn-off | on state | xV in Table 1 may be a reference voltage indicating that the voltage of the battery cell 301 has been over-discharged and, when the battery cell 301 falls within the first range, the voltage of the battery cell 301 is measured via the first path (e.g., the first sub path and the fourth sub path) with the highest resistance, and the leakage current may thus be suppressed. yV in Table 1 may be a reference voltage set to start charging the battery cell 301 in a designated mode (e.g., quick charging mode). Starting charging in the designated mode requires measurement of stable, fluctuation-suppressed voltage. Thus, according to an embodiment, the battery pack 300 or electronic device 101 may turn on the buffer circuit and turn off the switches 812 and 822, thereby allowing the sensing circuit 330 to sense fluctuation-suppressed output voltage. The offset adjustment value of the offset block 814 and 824 may be set as a value for compensating for an influence that the off state of the protection circuits 411 and 412 of the battery pack 300 has on the voltage. For example, different measurements for the voltage applied to both ends of the battery cell 301 may be obtained by the sensing circuit 330 between when the protection circuits 411 and 412 are in the on state and when the protection circuits 411 and 412 are in the off state. The offset blocks 814 and 824 may apply an offset voltage for compensation depending on whether the protection circuits 411 and 412 are in the on or off state, thus enabling more precise measurement of the voltage of battery cell 301.

As set forth above, a control signal for controlling the on/off state of the first switch 612 and the second switch 622 and a control signal for turning on or off the buffer circuit may be generated inside the sensing path selection block 800 or generated by a hardware component outside the sensing path selection block 800.

For example, when an external power supply is connected with the charging circuit 320 (e.g., the charging circuit 210), the charging circuit 320 may determine the charging mode of the battery cell 301 based on the voltage applied to the battery cell 301. For example, the charging circuit 320 may be configured to begin quick charging when the voltage applied to the battery cell 301 is yV in Table 1. When the voltage applied to the battery cell 301 falls within the first range, the charging circuit 320 may charge the battery cell 301 with power received from the outside. During the course, the sensing circuit 330 may identify the voltage of the battery cell 301 through the first path with the highest resistance, and the magnitude of leakage current from the battery cell 301 to the sensing circuit 330 may be suppressed. When the voltage applied to the battery cell 301 falls within the second range, the charging circuit 320 may charge the battery cell 301 with power received from the outside. During the course, the sensing circuit 330 may sense a stable, fluctuation-suppressed voltage through the second path, thus enabling more accurate start of quick charging. When the voltage of the battery cell 301 falls within the third range, the charging circuit 320 may charge the battery cell 301, e.g., in the quick charging mode. During the course, the sensing circuit 330 may sense voltage via the third path which corresponds to the lowest resistance.

The embodiment of FIG. 8 is merely an example, and the disclosure is not limited thereto. For example, according to an embodiment, the battery pack 300 may be configured to include a switch for connecting the voltage sensing terminal P+sense to any one of the first to third sub paths and a switch for connecting the voltage sensing terminal P−sense to any one of the fourth to sixth sub paths as shown in FIG. 4B.

Figure 9:
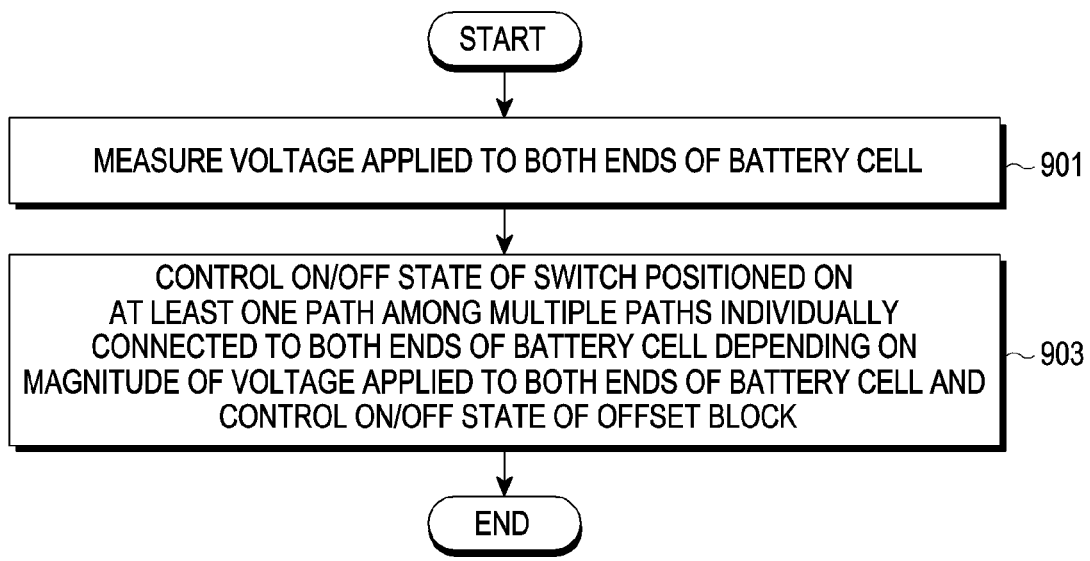
FIG. 9 is a flowchart illustrating an example method of operation of a battery pack or an electronic device according to an embodiment.

FIG. 9 is a flowchart 9 illustrating an example method of operation of a battery pack 300 or an electronic device 101 according to an embodiment.

According to an embodiment, in operation 901, the battery pack 300 or the electronic device 101 may measure or sense the voltage applied to both ends of the battery cell 301. In operation 903, the battery pack 300 or electronic device 101 may control the on/off state of a switch (e.g., the switches 812 and 822 of FIG. 8) positioned on at least one path among a plurality of paths individually connected to both ends of the battery cell 301 depending on the magnitude of voltage applied to both ends of the battery cell 301, and the battery pack 300 or electronic device 101 and may also control the on/off state of the offset block (e.g., the offset blocks 814 and 824 of FIG. 8).

Figure 10:
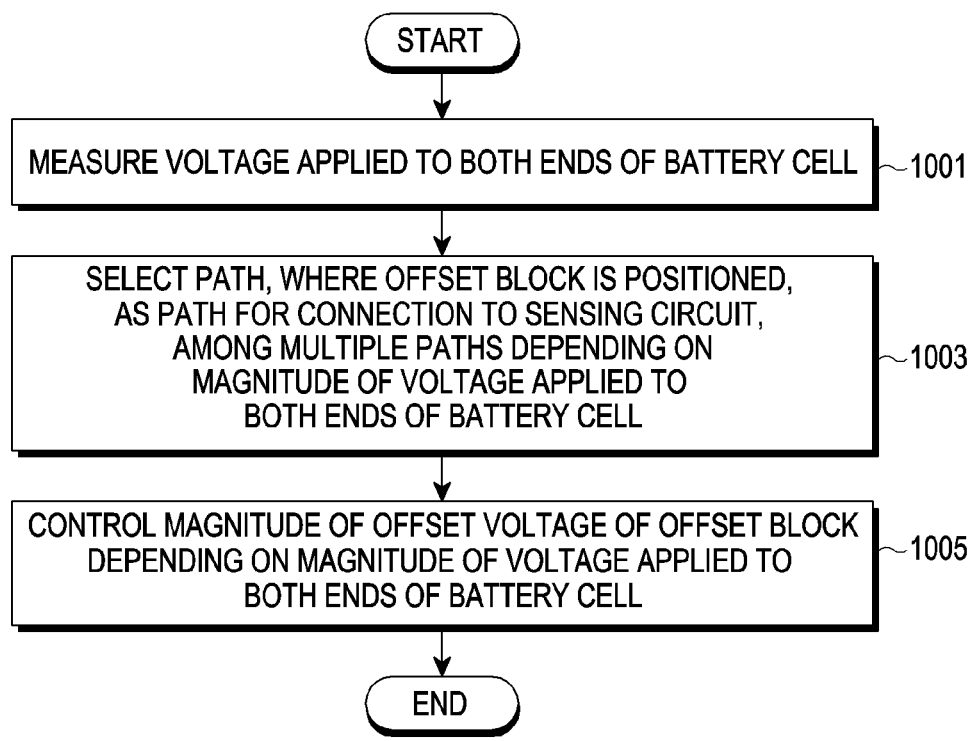
FIG. 10 is a flowchart illustrating an example method of operation of a battery pack or an electronic device according to an embodiment.

FIG. 10 is a flowchart 9 illustrating an example method of operation of a battery pack 300 or an electronic device 101 according to an embodiment.

According to an embodiment, in operation 1001, the battery pack 300 or the electronic device 101 may measure or sense the voltage applied to both ends of the battery cell 301. In operation 1003, the battery pack 300 or electronic device 101 may select the path, where the offset block (e.g., the offset blocks 814 and 824 of FIG. 8) is positioned, as a path to be connected to the sensing circuit 330, among a plurality of paths depending on the magnitude of voltage applied to both ends of the battery cell 301. In operation 1005, the battery pack 300 or electronic device 101 may control the magnitude of offset voltage of the offset block (e.g., the offset blocks 814 and 824 of FIG. 8) depending on the magnitude of voltage applied to both ends of the battery cell 301. As set forth above, the voltage of the battery cell 301 may be inaccurately measured or sensed by the sensing circuit 330 depending on the on/off state of the protection circuits 411 and 412 of the battery pack 300. Thus, according to an embodiment, the battery pack 300 or electronic device 101 may control the offset block (e.g., the offset blocks 814 and 824 of FIG. 8) to add a preset offset depending on the on/off state of the protection circuits 411 and 412.

Figure 11:
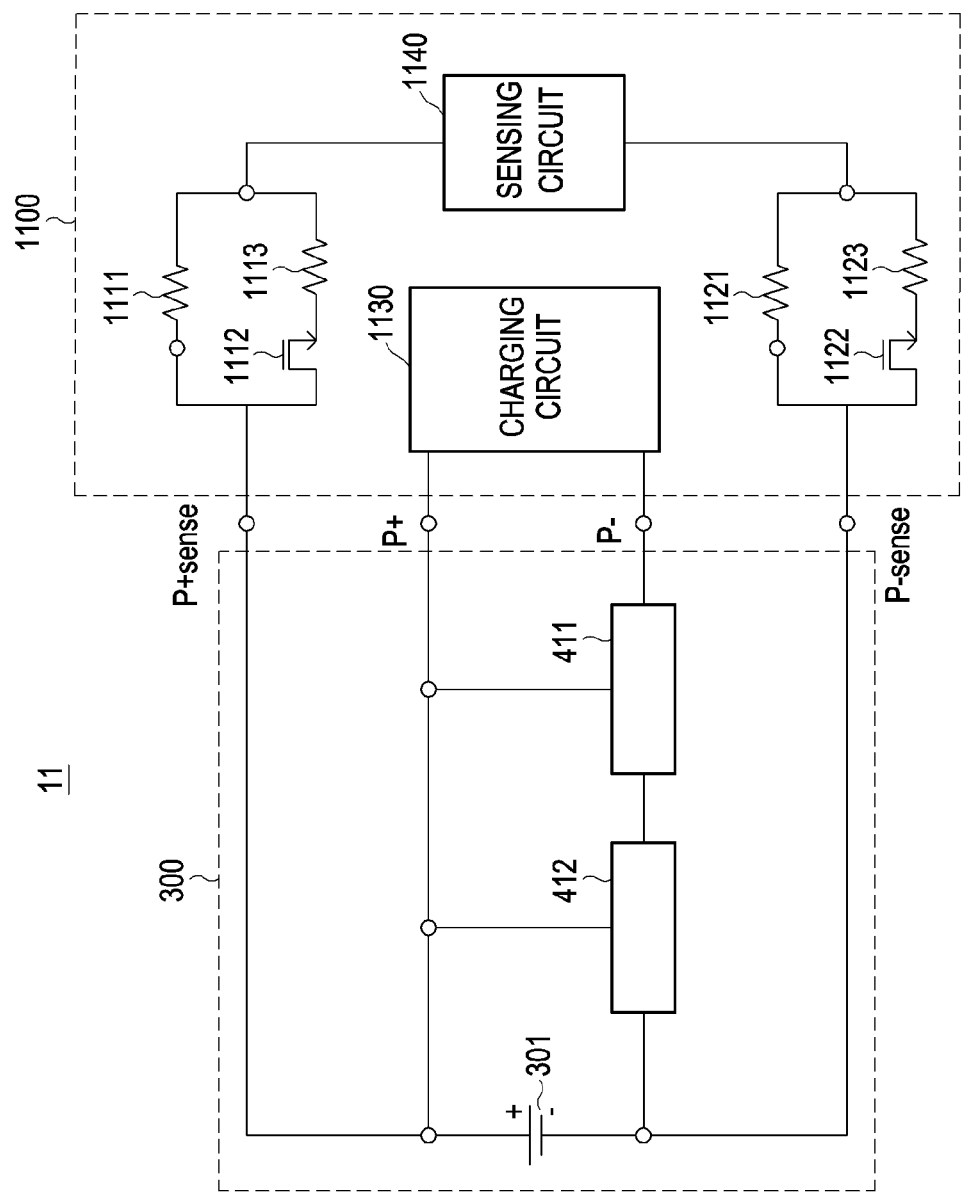
FIG. 11 is a diagram illustrating an example electronic device according to an embodiment.

FIG. 11 is a diagram 11 illustrating an example electronic device 1100 according to an embodiment.

According to an embodiment, an electronic device 1100 (e.g., the electronic device 101) may include a charging circuit 1130 (e.g., the charging circuit 1130 (e.g., the charging circuit 210)) connected to power output terminals P+ and P− and a sensing circuit 1140 (e.g., the sensing circuit 330) connected to voltage sensing terminals (P+sense, P−sense). Although not shown, the electronic device 1100 may further include a system, and the system may be connected to the power output terminals P+ and P−. The electronic device 1100 may include a plurality of paths for connecting the voltage sensing terminals (P+sense, P−sense) to the sensing circuit 1130. For example, the electronic device 1100 may include a first sub path and a second sub path for connecting the voltage sensing terminal P+sense to one end of the sensing circuit 1130. A first resistor 1111 with a relatively higher resistance than a second resistor 1113 may be positioned on the first sub path, and the second resistor 1113 with a relatively lower resistance than the first resistor 1111 may be positioned on the second sub path. A first switch 1112 may be positioned on the second sub path, and the first switch 1112 may selectively connect the voltage sensing terminal P+sense and the second resistor 1113. For example, the electronic device 1100 may include a third sub path and a fourth sub path for connecting the voltage sensing terminal P+sense to the other end of the sensing circuit 1130. A third resistor 1121 with a relatively higher resistance than a fourth resistor 1123 may be positioned on the third sub path, and the fourth resistor 1123 with a relatively lower resistance than the third resistor 1121 may be positioned on the fourth sub path. A second switch 1122 may be positioned on the fourth sub path, and the second switch 1122 may selectively connect the voltage sensing terminal P−sense and the fourth resistor 1123.

Similar to the operation of the battery pack 300 as described above in connection with FIG. 4A, the electronic device 1100, when the voltage of the battery cell 301 is a first value or more, may control the switches 1112 and 1122 to turn on, so that the voltage of the battery cell 301 may be measured via the second path (e.g., the second sub path and the first sub path). When the voltage of the battery cell 301 is less than the first value, the electronic device 1100 may control the switches 1112 and 1122 to turn off, so that the voltage of the battery cell 301 may be measured via the first path (e.g., the first sub path and the third sub path). Since the first path has a relatively higher resistance than the second path, leakage current may be suppressed in such a case.

Figure 12:
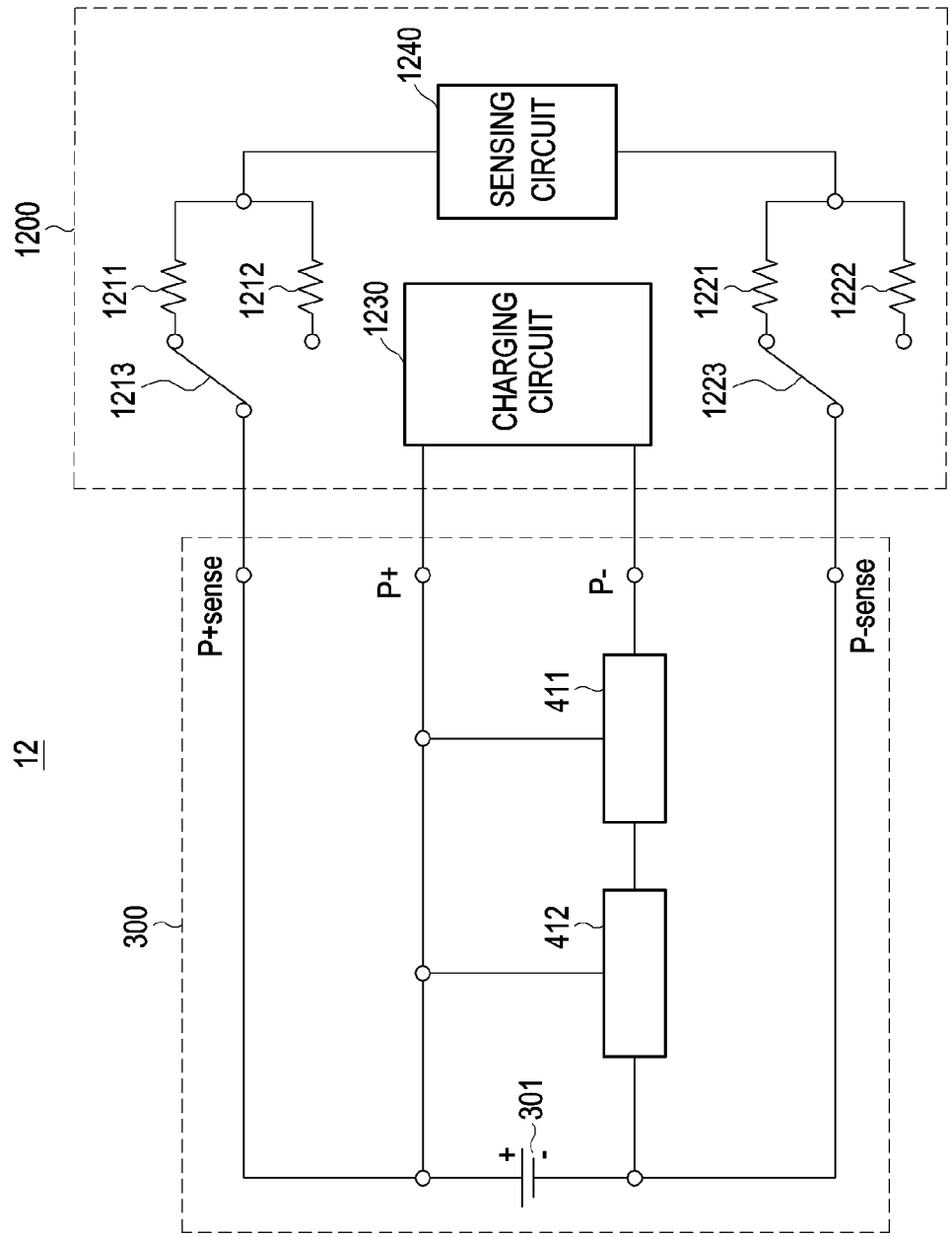
FIG. 12 is a diagram illustrating an example electronic device according to an embodiment.

FIG. 12 is a view 12 illustrating an example electronic device 1200 according to an embodiment.

According to an embodiment, an electronic device 1200 (e.g., the electronic device 101) may include a charging circuit 1230 (e.g., the charging circuit 1130 (e.g., the charging circuit 210)) connected to power output terminals P+ and P− and a sensing circuit 1240 (e.g., the sensing circuit 330) connected to voltage sensing terminals (P+sense, P−sense). Although not shown, the electronic device 1200 may further include a system, and the system may be connected to the power output terminals P+ and P−. The electronic device 1200 may include a plurality of paths for connecting the voltage sensing terminals (P+sense, P−sense) to the sensing circuit 1230. For example, the electronic device 1200 may include a first sub path and a second sub path for connecting the voltage sensing terminal P+sense to one end of the sensing circuit 1230. A first resistor 1211 with a relatively higher resistance than a second resistor 1212 may be positioned on the first sub path, and the second resistor 1212 with a relatively lower resistance than the first resistor 1211 may be positioned on the second sub path. The first switch 1213 may selectively connect the voltage sensing terminal P+sense to any one of the first resistor 1211 or the second resistor 1212. For example, the electronic device 1200 may include a third sub path and a fourth sub path for connecting the voltage sensing terminal P+sense to the other end of the sensing circuit 1230. A third resistor 1221 with a relatively higher resistance than a fourth resistor 1222 may be positioned on the third sub path, and the fourth resistor 1222 with a relatively lower resistance than the third resistor 1221 may be positioned on the fourth sub path. The second switch 1223 may selectively connect the voltage sensing terminal P−sense to any one of the third resistor 1221 or the fourth resistor 1222. Similar to the operation of the battery pack 300 as described above in connection with FIG. 4B, the electronic device 1200, when the voltage of the battery cell 301 is a first value or more, may control the first switch 1213 to connect to the second resistor 1212 and may control the second switch 1223 to the fourth resistor 1222. When the voltage of the battery cell 301 is less than the first value, the electronic device 1200 may control the first switch 1213 to connect to the first resistor 1211 and may control the second switch 1223 to connect to the third resistor 1221.

Figure 13:
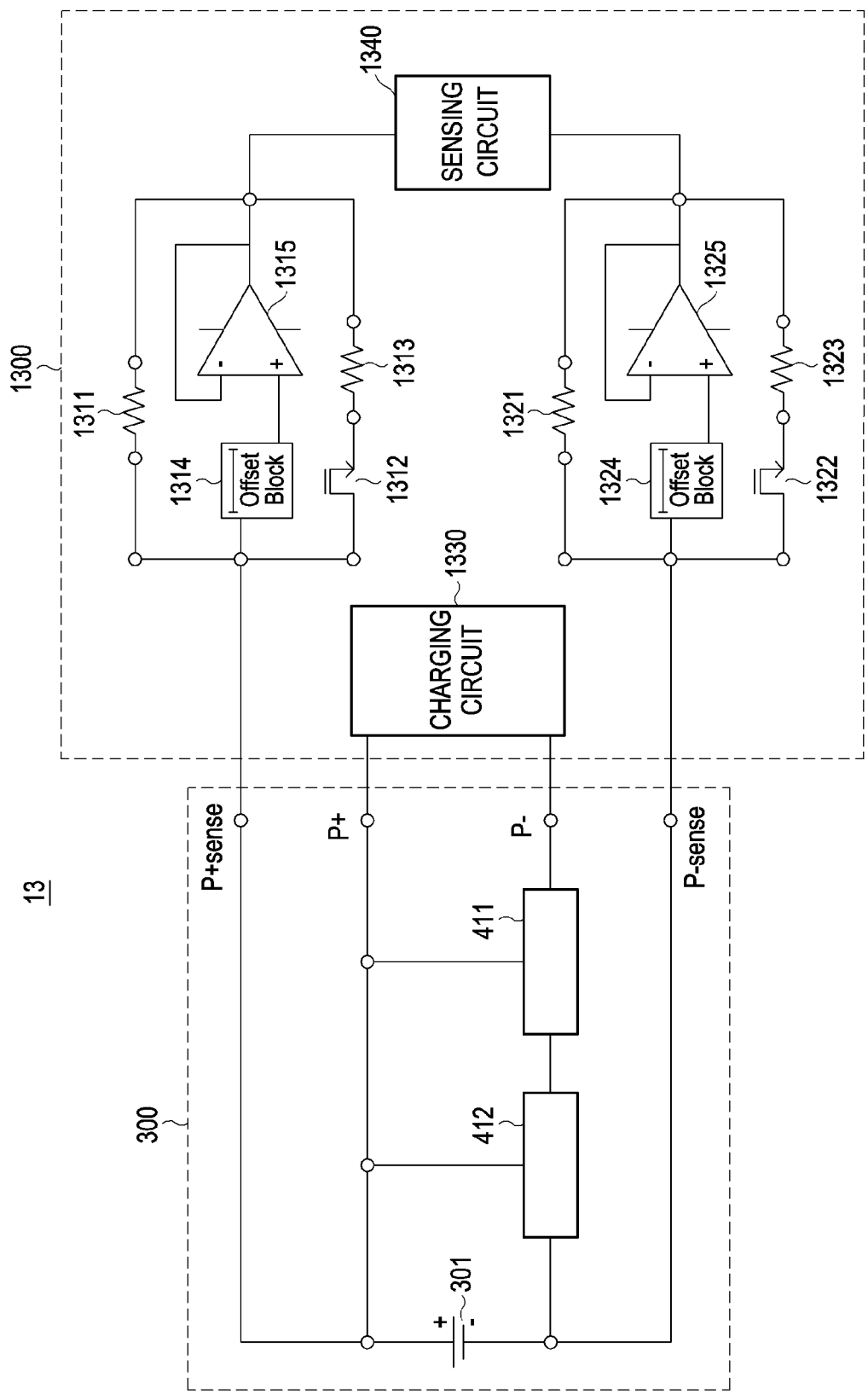
FIG. 13 is a diagram illustrating an example electronic device according to an embodiment.

FIG. 13 is a diagram 13 illustrating an example electronic device 1300 according to an embodiment.

According to an embodiment, an electronic device 1300 (e.g., the electronic device 101) may include a charging circuit 1330 (e.g., the charging circuit 1130 (e.g., the charging circuit 210) connected to power output terminals P+ and P− and a sensing circuit 1340 (e.g., the sensing circuit 330) connected to voltage sensing terminals (P+sense, P−sense). Although not shown, the electronic device 1300 may further include a system, and the system may be connected to the power output terminals P+ and P−. The electronic device 1300 may include a plurality of paths for connecting the voltage sensing terminals (P+sense, P−sense) to the sensing circuit 1340. For example, the electronic device 1300 may include a first sub path, a second sub path, and a third sub path for connecting the voltage sensing terminal P+sense to one end of the sensing circuit 1340. A first resistor 1311 with a relatively higher resistance than the resistance of a second resistor 1313 may be positioned on the first sub path, a first offset block 1314 and a first OP-AMP 1315 may be placed on the second sub path, and the second resistor 1313 with a relatively lower resistance than the resistance of the first resistor 1311 and a first switch 1312 for selectively connecting the voltage sensing terminal P+sense to the second resistor 1313 may be placed on the third sub path. For example, the electronic device 1300 may include a fourth sub path, a fifth sub path, and a sixth sub path for connecting the voltage sensing terminal P−sense to the other end of the sensing circuit 1340. A third resistor 1321 with a relatively higher resistance than the resistance of a fourth resistor 1323 may be positioned on the fourth sub path, a second offset block 1324 and a second OP-AMP 1325 may be placed on the fifth sub path, and the fourth resistor 1323 with a relatively lower resistance than the resistance of the third resistor 1321 and a second switch 1323 for selectively connecting the voltage sensing terminal P−sense to the fourth resistor 1323 may be placed on the sixth sub path.

Similar to the operation of the battery pack 300 as described above in connection with FIG. 8, the electronic device 1300, when the voltage of the both ends of the battery cell 301 falls within the first range, may control the switches 1312 and 1322 to turn off and turn off the offset blocks 1314 and 1324 so as to allow the sensing circuit 1340 to perform sensing via the first path (e.g., the first sub path and the fourth sub path). When the voltage of the both ends of the battery cell 301 falls within the second range, the electronic device 1300 may control the switches 1312 and 1322 to turn off and turn on the offset blocks 1314 and 1324 so as to allow the sensing circuit 1340 to perform sensing via the second path (e.g., the second sub path and the fifth sub path). When the voltage of the both ends of the battery cell 301 falls within the third range, the electronic device 1300 may control the switches 1312 and 1322 to turn on and turn off the offset blocks 1314 and 1324 so as to allow the sensing circuit 1340 to perform sensing via the third path (e.g., the third sub path and the sixth sub path).

The embodiment of FIG. 13 is merely an example and the disclosure is not limited thereto. According to an embodiment, the electronic device 101 may be configured to include a switch for connecting the voltage sensing terminal P+sense to any one of the first to third sub paths and a switch for connecting the voltage sensing terminal P−sense to any one of the fourth to sixth sub paths as shown in FIG. 12.

According to an example embodiment, a battery pack (e.g., the battery pack 300) comprises a battery cell (e.g., the battery cell 301) including a positive electrode (+) and a negative electrode (−) and configured to generate an electromotive force via the positive electrode (+) and the negative electrode (−), a plurality of first sub paths configured to connect the positive electrode (+) to a sensing circuit (e.g., the sensing circuit 330) of an electronic device (e.g., the electronic device 101) to which the battery pack (e.g., the battery pack 300) is connected, a plurality of second sub paths configured to connect the negative electrode (−) to the sensing circuit (e.g., the sensing circuit 330), a power line configured to connect the positive electrode (+) and the negative electrode (−) to at least one of a system (e.g., the system 340) of the electronic device (e.g., the electronic device 101) or a charging circuit (e.g., the charging circuit 320) of the electronic device (e.g., the electronic device 101), a first switch configured to selectively connect at least one of the plurality of first sub paths, selected depending on a voltage applied to the positive electrode (+) and the negative electrode (−), to the sensing circuit (e.g., the sensing circuit 330), and a second switch configured to selectively connect at least one of the plurality of second sub paths, selected depending on the voltage, to the sensing circuit (e.g., the sensing circuit 330). The first sub path and the second sub path may differ from the power line. The state of each of the first switch and the second switch may be controlled by a voltage applied to both ends of the battery cell (e.g., the battery cell 301).

According to an example embodiment, each of the plurality of first sub paths may have a different resistance, and each of the plurality of second sub paths may have a different resistance.

According to an example embodiment, based on the voltage falling within a first range, a state of the first switch may be controlled to connect a path with a lower resistance, other than the other paths, among the plurality of first sub paths, to the sensing circuit (e.g., the sensing circuit 330), and a state of the second switch may be controlled to connect a path with a lower resistance, other than the other paths, among the plurality of second sub paths, to the sensing circuit (e.g., the sensing circuit 330).

According to an example embodiment, based on the voltage falling within a second range, a state of the first switch may be controlled to connect a path with a higher resistance, other than the other paths, among the plurality of first sub paths, to the sensing circuit (e.g., the sensing circuit 330), and a state of the second switch may be controlled to connect a path with a higher resistance, other than the other paths, among the plurality of second sub paths, to the sensing circuit (e.g., the sensing circuit 330).

According to an example embodiment, the first switch may be configured to selectively connect the positive electrode (+) to a path with a lower resistance, other than the other paths, among the plurality of first sub paths, and the second switch may be configured to selectively connect the negative electrode (−) to a path with a lower resistance, than the other paths, among the plurality of second sub paths.

According to an example embodiment, the first switch may be controlled to turn on when the voltage falls within a first range, and the first switch may be controlled to turn off when the voltage falls within a second range, and the second switch may be controlled to turn on when the voltage applied to both ends of the battery cell (e.g., the battery cell 301) falls within the first range, and the second switch may be controlled to turn off when the voltage falls within the second range.

According to an example embodiment, the first switch may be configured to connect the positive electrode (+) of the battery cell (e.g., the battery cell 301) to any one of the plurality of first sub paths, and the second switch may connect the negative electrode (−) of the battery cell (e.g., the battery cell 301) to any one of the plurality of second sub paths.

According to an example embodiment, the first switch may be configured to connect the positive electrode (+) of the battery cell (e.g., the battery cell 301) to a path with a lower resistance, other than the other paths, among the plurality of first sub paths based on the voltage falling within the first range, and the first switch may be configured to connect the positive electrode (+) of the battery cell (e.g., the battery cell 301) to a path with a higher resistance, other than the other paths, among the plurality of first sub paths based on the voltage applied to both ends of the battery cell (e.g., the battery cell 301) falling within the second range, and the second switch may be configured to connect the negative electrode (−) of the battery cell (e.g., the battery cell 301) to a path with a lower resistance, other than the other paths, among the plurality of second sub paths based on the voltage falling within the first range, and the second switch may connect the negative electrode (−) of the battery cell (e.g., the battery cell 301) to a path with a higher resistance, other than the other paths, among the plurality of second sub paths based on the voltage falling within the second range.

According to an example embodiment, the battery pack (e.g., the battery pack 300) may further comprise at least one protection circuit, wherein the at least one protection circuit is configured to connect the battery cell (e.g., the battery cell 301) to at least one of the system (e.g., the system 340) or the charging circuit based on the voltage falling within the first range, and the at least one protection circuit is configured to not connect the battery cell (e.g., the battery cell 301) to the system (e.g., the system 340) and the charging circuit based on the voltage falling within the second range.

According to an example embodiment, at least one of the plurality of first sub paths may include a first offset block and a first operational amplifier (OP-AMP), and at least one of the plurality of second sub paths may include a second offset block and a second OP-AMP. Based on the voltage falling within a third range, the first offset block may apply a first offset voltage to a voltage applied from the positive electrode (+), the first OP-AMP may be configured to remove noise from a voltage output from the first offset block and output the noise-removed voltage to the sensing circuit (e.g., the sensing circuit 330), the second offset block may be configured to apply a second offset voltage to a voltage input from the negative electrode (−), and the second OP-AMP may be configured to remove noise from a voltage output from the second offset block and output the noise-removed voltage to the sensing circuit (e.g., the sensing circuit 330).

According to an example embodiment, an electronic device (e.g., the electronic device 101) electrically connected with a battery pack (e.g., the battery pack 300) comprises a sensing circuit (e.g., the sensing circuit 330) configured to sense a voltage applied to a positive electrode (+) and a negative electrode (−) of a battery cell (e.g., the battery cell 301) included in the battery pack (e.g., the battery pack 300) and configured to generate an electromotive force via the positive electrode (+) and the negative electrode (−), a plurality of first sub paths configured to connect the positive electrode (+) to the sensing circuit (e.g., the sensing circuit 330), a plurality of second sub paths configured to connect the negative electrode (−) to the sensing circuit (e.g., the sensing circuit 330), a power line configured to receive power from the battery cell (e.g., the battery cell 301), a first switch configured to selectively connect at least one, selected among the plurality of first sub paths depending on the voltage, to the sensing circuit (e.g., the sensing circuit 330), and a second switch configured to selectively connect at least one, selected among the plurality of second sub paths depending on the voltage, to the sensing circuit (e.g., the sensing circuit 330). The first sub path and the second sub path may differ from the power line. The state of each of the first switch and the second switch may be controlled by a voltage applied to both ends of the battery cell (e.g., the battery cell 301).

According to an example embodiment, each of the plurality of first sub paths may have a different resistance, and each of the plurality of second sub paths may have a different resistance.

According to an example embodiment, based on the voltage falling within a first range, a state of the first switch may be controlled to connect a path with a lower resistance, other than the other paths, among the plurality of first sub paths, to the sensing circuit (e.g., the sensing circuit 330), and a state of the second switch may be controlled to connect a path with a lower resistance, other than the other paths, among the plurality of second sub paths, to the sensing circuit (e.g., the sensing circuit 330).

According to an example embodiment, based on the voltage falling within a second range, a state of the first switch may be controlled to connect a path with a higher resistance, other than the other paths, among the plurality of first sub paths, to the sensing circuit (e.g., the sensing circuit 330), and a state of the second switch may be controlled to connect a path with a higher resistance, other than the other paths, among the plurality of second sub paths, to the sensing circuit (e.g., the sensing circuit 330).

According to an example embodiment, the first switch may be configured to selectively connect the positive electrode (+) to a path with a lower resistance, other than the other paths, among the plurality of first sub paths, and the second switch may be configured to selectively connect the negative electrode (−) to a path with a lower resistance, than the other paths, among the plurality of second sub paths.

According to an example embodiment, the first switch may be controlled to turn on when the voltage falls within a first range, and the first switch may be controlled to turn off based on the voltage falling within a second range, and the second switch may be controlled to turn on based on the voltage applied to both ends of the battery cell (e.g., the battery cell 301) falling within the first range, and the second switch may be controlled to turn off based on the voltage falling within the second range.

According to an example embodiment, the first switch may be configured to connect the positive electrode (+) of the battery cell (e.g., the battery cell 301) to any one of the plurality of first sub paths, and the second switch may be configured to connect the negative electrode (−) of the battery cell (e.g., the battery cell 301) to any one of the plurality of second sub paths.

According to an example embodiment, the first switch may be configured to connect the positive electrode (+) of the battery cell (e.g., the battery cell 301) to a path with a lower resistance among the plurality of first sub paths based on the voltage falling within the first range, and the first switch may be configured to connect the positive electrode (+) of the battery cell (e.g., the battery cell 301) to a path with a higher resistance among the plurality of first sub paths based on the voltage falling within the second range, and the second switch may be configured to connect the negative electrode (−) of the battery cell (e.g., the battery cell 301) to a path with a lower resistance among the plurality of second sub paths based on the voltage falling within the first range, and the second switch may be configured to connect the negative electrode (−) of the battery cell (e.g., the battery cell 301) to a path with a higher resistance among the plurality of second sub paths based on the voltage falling within the second range.

According to an example embodiment, the battery pack (e.g., the battery pack 300) may further comprise at least one protection circuit, wherein the at least one protection circuit is configured to connect the battery cell (e.g., the battery cell 301) to at least one of a system (e.g., the system 340) of the electronic device (e.g., the electronic device 101) or a charging circuit of the electronic device (e.g., the electronic device 101) based on the voltage falling within the first range, and the at least one protection circuit is configured to not connect the battery cell (e.g., the battery cell 301) to the system (e.g., the system 340) and the charging circuit based on the voltage falling within the second range.

According to an example embodiment, at least one of the plurality of first sub paths may include a first offset block and a first operational amplifier (OP-AMP), and at least one of the plurality of second sub paths may include a second offset block and a second OP-AMP. Based on the voltage falling within a third range, the first offset block may be configured to apply a first offset voltage to a voltage applied from the positive electrode (+), the first OP-AMP may be configured to remove noise from a voltage output from the first offset block and output the noise-removed voltage to the sensing circuit (e.g., the sensing circuit 330), the second offset block may be configured to apply a second offset voltage to a voltage input from the negative electrode (−), and the second OP-AMP may be configured to remove noise from a voltage output from the second offset block and output the noise-removed voltage to the sensing circuit (e.g., the sensing circuit 330).

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic device is not limited to the above-listed embodiments.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

As is apparent from the foregoing description, according to various embodiments, there may be provided a battery pack and electronic device which include a plurality of paths for measuring a battery cell and may measure the battery cell depending on the voltage of the battery cell. This allows for measurement of the voltage of the battery cell via the path which may reduce leakage current when the battery is over-discharged while preventing extra discharging of the battery. According to various embodiments, there may be provided a battery pack and electronic device including a buffer circuit, which may measure the voltage of the battery cell in a noise-suppressed, accurate manner.

While the disclosure has been illustrated and described with reference to various example embodiments thereof, it will be understood by those skilled in the art that various changes in form and details may be made therein without departing from the spirit and scope of the disclosure as illustrated, for example, in the appended claims and their equivalents.

What is claimed is:

1. A battery pack, comprising:
   a battery cell, including a positive electrode and a negative electrode, configured to generate an electromotive force via the positive electrode and the negative electrode;
   a plurality of first sub paths configured to connect the positive electrode to a sensing circuit of an electronic device to which the battery pack is connected;
   a plurality of second sub paths configured to connect the negative electrode to the sensing circuit;
   a first power line configured to connect the positive electrode to at least one of a system of the electronic device or a charging circuit of the electronic device;

a second power line configured to connect the negative electrode to the at least one of the system of the electronic device or the charging circuit;

a first switch configured to selectively connect at least one of the plurality of first sub paths to the sensing circuit, wherein the at least one of the plurality of first sub paths is selected based on a voltage applied to the positive electrode and the negative electrode; and a second switch configured to selectively connect at least one of the plurality of second sub paths to the sensing circuit, wherein the at least one of the plurality of second sub paths is selected based on the voltage.

2. The battery pack of claim 1, wherein each of the plurality of first sub paths has a different resistance, and each of the plurality of second sub paths has a different resistance.

3. The battery pack of claim 2, wherein a state of the first switch is configured to be controlled to connect a path with a relatively lower resistance, among the plurality of first sub paths, to the sensing circuit based on the voltage falling within a first range, and a state of the second switch is configured to be controlled to connect a path with a relatively lower resistance, among the plurality of second sub paths, to the sensing circuit based on the voltage falling within the first range.

4. The battery pack of claim 3, wherein a state of the first switch is configured to be controlled to connect a path with a relatively higher resistance, among the plurality of first sub paths, to the sensing circuit based on the voltage falling within a second range, and a state of the second switch is configured to be controlled to connect a path with a relatively higher resistance, among the plurality of second sub paths, to the sensing circuit based on the voltage falling within the second range.

5. The battery pack of claim 1, wherein the first switch is configured to selectively connect the positive electrode to a path with a relatively lower resistance, among the plurality of first sub paths, and the second switch is configured to selectively connect the negative electrode to a path with a relatively lower resistance, among the plurality of second sub paths.

6. The battery pack of claim 5, wherein the first switch is configured to be controlled to turn on based on the voltage falling within a first range, and the first switch is configured to be controlled to turn off based on the voltage falling within a second range, and wherein the second switch is configured to be controlled to turn on based on the voltage falling within the first range, and the second switch is configured to be controlled to turn off based on the voltage falling within the second range.

7. The battery pack of claim 4, wherein the first switch is configured to connect the positive electrode of the battery cell to any one of the plurality of first sub paths, and the second switch is configured to connect the negative electrode of the battery cell to any one of the plurality of second sub paths.

8. The battery pack of claim 7, wherein the first switch is configured to connect the positive electrode of the battery cell to a path with a relatively lower resistance, among the plurality of first sub paths based on the voltage falling within the first range, and the first switch is configured to connect the positive electrode of the battery cell to a path with a relatively higher resistance, among the plurality of first sub paths based on the voltage falling within the second range, and wherein the second switch is configured to connect the negative electrode of the battery cell to a path with a relatively lower resistance, among the plurality of second sub paths based on the voltage falling within the first range, and the second switch is configured to connect the negative electrode of the battery cell to a path with a relatively higher resistance, among the plurality of second sub paths based on the voltage falling within the second range.

9. The battery pack of claim 3, further comprising at least one protection circuit, wherein the at least one protection circuit is configured to connect the battery cell to at least one of the system or the charging circuit based on the voltage falling within the first range, and the at least one protection circuit is configured to not connect the battery cell to the system and the charging circuit based on the voltage falling within the second range.

10. The battery pack of claim 1, wherein at least one of the plurality of first sub paths includes a first offset block and a first operational amplifier (OP-AMP), and at least one of the plurality of second sub paths includes a second offset block and a second OP-AMP, and wherein based on the voltage falling within a third range, the first offset block is configured to apply a first offset voltage to a voltage applied from the positive electrode, the first OP-AMP is configured to remove noise from a voltage output from the first offset block and output the noise-removed voltage to the sensing circuit, the second offset block is configured to apply a second offset voltage to a voltage input from the negative electrode, and the second OP-AMP is configured to remove noise from a voltage output from the second offset block and output the noise-removed voltage to the sensing circuit.

11. An electronic device electrically connected with a battery pack, the electronic device comprising:

a sensing circuit, included in the battery pack, configured to sense a voltage applied to a positive electrode and a negative electrode of a battery cell configured to generate an electromotive force via the positive electrode and the negative electrode;

a plurality of first sub paths configured to connect the positive electrode to the sensing circuit;

a plurality of second sub paths configured to connect the negative electrode to the sensing circuit;

a plurality of power lines configured to receive power from the battery cell, wherein a first power line of the plurality of power lines is electrically connected to the positive electrode and a second power line of the plurality of power lines is electrically connected to the negative electrode;

a first switch configured to selectively connect at least one of the plurality of first sub paths to the sensing circuit, wherein the at least one of the plurality of first sub paths is selected based on the voltage; and a second switch configured to selectively connect at least one of the plurality of second sub paths to the sensing circuit, wherein the at least one of the plurality of second sub paths is selected based on the voltage.

12. The electronic device of claim 11, wherein each of the plurality of first sub paths has a different resistance, and each of the plurality of second sub paths has a different resistance.

13. The electronic device of claim 12, wherein a state of the first switch is configured to be controlled to connect a path with a lower resistance, among the plurality of first sub paths, to the sensing circuit based on the voltage falling within a first range, and a state of the second switch is configured to be controlled to connect a path with a lower resistance, among the plurality of second sub paths, to the sensing circuit based on the voltage falling within the first range.

14. The electronic device of claim 13, wherein a state of the first switch is configured to be controlled to connect a path with a higher resistance, among the plurality of first sub paths, to the sensing circuit based on the voltage falling within a second range, and a state of the second switch is configured to be controlled to connect a path with a higher resistance, among the plurality of second sub paths, to the sensing circuit based on the voltage falling within the second range.

15. The electronic device of claim 11, wherein the first switch is configured to selectively connect the positive electrode to a path with a relatively lower resistance, among the plurality of first sub paths, and the second switch is configured to selectively connect the negative electrode to a path with a relatively lower resistance, among the plurality of second sub paths.

16. The electronic device of claim 15, wherein the first switch is configured to be controlled to turn on based on the voltage falling within a first range, and the first switch is controlled to turn off based on the voltage falling within a second range, and wherein the second switch is configured to be controlled to turn on based on the voltage falling within the first range, and the second switch is controlled to turn off based on the voltage falling within the second range.

17. The electronic device of claim 14, wherein the first switch is configured to connect the positive electrode of the battery cell to any one of the plurality of first sub paths, and the second switch is configured to connect the negative electrode of the battery cell to any one of the plurality of second sub paths.

18. The electronic device of claim 17, wherein the first switch is configured to connect the positive electrode of the battery cell to a path with a relatively lower resistance, among the plurality of first sub paths based on the voltage falling within the first range, and the first switch is configured to connect the positive electrode of the battery cell to a path with a relatively higher resistance, among the plurality of first sub paths based on the voltage falling within the second range, and wherein the second switch is configured to connect the negative electrode of the battery cell to a path with a relatively lower resistance, among the plurality of second sub paths based on the voltage falling within the first range, and the second switch is configured to connect the negative electrode of the battery cell to a path with a relatively higher resistance, among the plurality of second sub paths based on the voltage falling within the second range.

19. The electronic device of claim 13, wherein the battery pack further includes at least one protection circuit, wherein the at least one protection circuit is configured to connect the battery cell to at least one of a system of the electronic device or a charging circuit of the electronic device based on the voltage falling within the first range, and the at least one protection circuit is configured to not connect the battery cell to the system and the charging circuit based on the voltage falling within the second range.

20. The electronic device of claim 11, wherein at least one of the plurality of first sub paths includes a first offset block and a first operational amplifier (OP-AMP), and at least one of the plurality of second sub paths includes a second offset block and a second OP-AMP, and wherein based on the voltage falling within a third range, the first offset block is configured to apply a first offset voltage to a voltage applied from the positive electrode, the first OP-AMP is configured to remove noise from a voltage output from the first offset block and output the noise-removed voltage to the sensing circuit, the second offset block is configured to apply a second offset voltage to a voltage input from the negative electrode, and the second OP-AMP is configured to remove noise from a voltage output from the second offset block and output the noise-removed voltage to the sensing circuit.

* * * * *